US009390941B2

(12) United States Patent
Watanabe et al.

(10) Patent No.: US 9,390,941 B2

(45) Date of Patent: Jul. 12, 2016

(54) SAMPLE PROCESSING APPARATUS, SAMPLE PROCESSING SYSTEM, AND METHOD FOR PROCESSING SAMPLE

(75) Inventors: Seiichi Watanabe, Houfu (JP); Yutaka Kozuma, Kudamatsu (JP); Tooru Aramaki, Kudamatsu (JP); Naoki Yasui, Kudamatsu (JP); Norihiko Ikeda, Hiroshima (JP); Hiroaki Takikawa, Fujisawa (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 416 days.

(21) Appl. No.: 13/510,296

(22) PCT Filed: Nov. 16, 2010

(86) PCT No.: PCT/JP2010/070386

§ 371 (c)(1), (2), (4) Date: May 17, 2012

(87) PCT Pub. No.: WO2011/062162

PCT Pub. Date: May 26, 2011

(65) Prior Publication Data

US 2012/0228261 A1 Sep. 13, 2012

(30) Foreign Application Priority Data

Nov. 17, 2009 (JP) ................................ 2009-262244

(51) Int. Cl.

*H01L 21/306* (2006.01)
*C23F 1/00* (2006.01)
(Continued)

(52) U.S. Cl.

CPC ............ *H01L 21/32139* (2013.01); *G03F 7/40* (2013.01); *H01J 37/32357* (2013.01);
(Continued)

(58) Field of Classification Search

USPC ........... 156/345.28, 345.41, 345.48; 438/474, 438/798; 315/111.21; 250/492.2
See application file for complete search history.

(56) References Cited

U.S. PATENT DOCUMENTS 6,190,458 B1 * 2/2001 Harada ......................... 118/715
7,026,099 B2 4/2006 Kato et al.
(Continued)

FOREIGN PATENT DOCUMENTS

JP 5-211139 8/1993
JP 2001-308076 11/2001
(Continued)

OTHER PUBLICATIONS

English Machine Translation JP2005-158796, Matsuno et al dated Jun. 16, 2005.*

*Primary Examiner* — Rakesh Dhingra
(74) *Attorney, Agent, or Firm* — Baker Botts L.L.P.

(57) ABSTRACT

There is provided a VUV light processing apparatus that can apply vacuum ultraviolet light to the entire surface of a wafer in excellent reproducibility and can process the wafer with VUV (vacuum ultraviolet) light in excellent reproducibility. A VUV light processing apparatus includes: a chamber connected with a gas supply apparatus and an evacuation apparatus, the chamber being capable of reducing the pressure inside the chamber; a plasma light source that generates VUV light including a wavelength of 200 nm or less, the plasma light source including a plasma generating unit that generates plasma in the chamber; and a VUV transmission filter provided between a stage on which a sample to be processed is placed and the sample in the chamber, the VUV transmission filter transmitting the VUV light including a wavelength of 200 nm or less and not transmitting electrons, ions, and radicals in plasma, the VUV transmission filter having the outer diameter size larger than that of the sample.

16 Claims, 23 Drawing Sheets

(51) Int. Cl.

| | |
|---|---|
| ***H01L 21/3213*** | (2006.01) |
| ***G03F 7/40*** | (2006.01) |
| ***H01J 37/32*** | (2006.01) |
| ***H01L 21/027*** | (2006.01) |
| ***H01L 21/28*** | (2006.01) |

(52) U.S. Cl.

CPC ..... *H01J37/32807* (2013.01); *H01J 37/32816* (2013.01); *H01J 37/32871* (2013.01); *H01L 21/0273* (2013.01); *H01L 21/28035* (2013.01)

(56) References Cited

U.S. PATENT DOCUMENTS

| | | | | |
|---|---|---|---|---|
| 2001/0036732 | A1 | 11/2001 | Yoshida et al. | |
| 2002/0033233 | A1 * | 3/2002 | Savas | 156/345.48 |
| 2006/0141806 | A1 * | 6/2006 | Waldfried et al. | 438/778 |
| 2006/0160352 | A1 * | 7/2006 | Matsushita et al. | 438/622 |
| 2007/0009673 | A1 * | 1/2007 | Fukazawa et al. | 427/569 |
| 2008/0182419 | A1 | 7/2008 | Yasui et al. | |
| 2012/0077339 | A1 * | 3/2012 | Ko et al. | 438/631 |

FOREIGN PATENT DOCUMENTS

| | | |
|---|---|---|
| JP | 2002-110636 | 4/2002 |
| JP | 2003-316019 | 11/2003 |
| JP | 2004-273940 | 9/2004 |
| JP | 2005-158796 | 6/2005 |
| JP | 2005-197349 | 7/2005 |
| JP | 2008-198988 | 8/2008 |

* cited by examiner (COMPARATIVE EXAMPLE)

(COMPARATIVE EXAMPLE)

SAMPLE PROCESSING APPARATUS, SAMPLE PROCESSING SYSTEM, AND METHOD FOR PROCESSING SAMPLE

TECHNICAL FIELD

The present invention relates to a sample processing apparatus, a sample processing system, and a method for processing a sample, and more particularly to a sample processing apparatus that processes a sample using a VUV light (a vacuum ultraviolet light) from a plasma light source. The present invention further relates to a sample processing system and a method for processing a sample that can reduce roughness on the side surface of pattern lines or roughness of line width using VUV light.

BACKGROUND ART

There is being developed a VUV light (a vacuum ultraviolet light) processing apparatus that applies VUV (Vacuum Ultra-Violet) light to a sample such as a semiconductor device substrate (a wafer) or the like for processing.

A conventional VUV light (vacuum ultraviolet light) processing apparatus using an excimer lamp or the like at a wavelength of 200 nm or less generally processes a wafer as described in Patent Document 1, for example, in which a plurality of tubular excimer lamps are provided and vacuum ultraviolet light is applied to a wafer, which is a sample to be processed, for processing.

In such a conventional VUV light (vacuum ultraviolet light) processing apparatus using excimer lamps, cylindrical excimer lamps using dielectric barrier discharge at a wavelength of 200 nm or less, for example, are disposed in a lamp house. For the cylindrical excimer lamp, a Xe excimer lamp that emits excimer light at a wavelength of 172 nm is often used. In a processing chamber, a wafer in a diameter of 300 mm, for example, which is a sample to be processed, is placed on a wafer stage. Moreover, a window that can transmit vacuum ultraviolet light is disposed between the lamp house and the processing chamber in such a way that vacuum ultraviolet light emitted from the cylindrical excimer lamp is applied to the wafer. In this case, for a window material, a flat plate made of synthetic silica that can transmit excimer light at a wavelength of 172 nm, for example is used. The lamp house and the processing chamber are partitioned from each other by the window.

A gas inlet port and a gas outlet port are provided in the lamp house. In this case, $N_2$ gas is introduced, and the inside of the lamp house is substituted with $N_2$, thereby suppressing the attenuation of vacuum ultraviolet light due to $O_2$ in the air. At the same time, $N_2$ gas is introduced to cool the cylindrical excimer lamps and the window for mitigating a reduction in the light intensity of vacuum ultraviolet light in association with a shift of the transmission limit of vacuum ultraviolet light caused by a temperature rise of synthetic silica. Similarly, a gas inlet port and a gas outlet port are also provided in the processing chamber. In this case, $N_2$ gas is introduced, and the inside of the processing chamber is substituted with $N_2$, thereby suppressing the attenuation of vacuum ultraviolet light due to $O_2$ in the air.

Moreover, in another example, a vacuum outlet port provided on a processing chamber and a vacuum exhaust system are used to evacuate the inside of the processing chamber, and vacuum ultraviolet light is applied to a wafer. In still another example, a vacuum outlet port and a gas inlet port provided on a processing chamber, a vacuum exhaust system, and a gas supply system are used to evacuate the inside of the processing chamber, a gas is introduced into the processing chamber, and, under reduced pressure, vacuum ultraviolet light is applied to a wafer.

For the applications of the VUV (Vacuum Ultraviolet light) processing apparatus, there are low-k curing, post lithography (a reduction in resist LWR after lithography, that is, VUV curing) and so on. Among them, for techniques related to a reduction in resist LWR, there is plasma processing using HBr plasma, $N_2$ plasma, or the like as in Patent Document 2, that is, a reduction in resist LWR by plasma curing.

A technique that forms fine patterns is necessary to increase the integration degree of semiconductor integrated circuits. Generally, in the semiconductor manufacturing processes, photolithography techniques are used.

In the photolithography techniques, first, a photoresist material is coated on a thin film laminate on a semiconductor substrate, and ultraviolet light or the like is applied using an exposure apparatus. Thus, circuit patterns formed on a photomask are transferred to the resist material, and the transferred resist material is further developed.

A plasma processing apparatus is generally used for the process of transferring the circuit patterns of the developed photoresist to under layers of laminate thin films. The plasma processing apparatus usually includes a vacuum chamber, an exhaust system that keeps the pressure inside a processing chamber formed in the vacuum chamber to a predetermined pressure, a plasma gas supply system, a wafer mounting electrode that places and fixes a wafer thereon, and an upper electrode including an antenna to generate plasma. A process gas is introduced into the processing chamber, and glow discharge is generated in the introduced process gas (mixed gas), thereby generating plasma. The generated plasma is used to generate highly reactive radicals and ions for etching.

For a method of forming a fine gate electrode by etching, Patent Document 3, for example, describes that an insulating film, a conductive layer, and an organic material layer are formed on a semiconductor substrate, a first mask pattern in a mask dimension $\beta$ is formed on the organic material layer using the photolithography techniques, the organic material layer is etched using a mixed gas of $Cl_2$ and $O_2$, the first mask pattern is shrunk to form a second mask pattern in a mask dimension Y ($<\beta$), the conductive layer is etched using the second mask pattern, and then a gate electrode in dimensions smaller than the mask dimension $\beta$ is obtained.

Furthermore, for methods of improving the etch resistance of a resist, there is described a process in which an electron beam is applied to cure a photoresist (see Patent Document 4), or a process in which vacuum ultraviolet light at a wavelength of 200 nm or less is applied to a resist pattern obtained by development for curing (see Patent Document 5).

PRIOR ART DOCUMENTS

Patent Documents

Patent Document 1: Japanese Patent Application Laid-Open Publication No. 2005-158796

Patent Document 2: Japanese Patent Application Laid-Open Publication No. 2008-198988

Patent Document 3: Japanese Patent Application Laid-Open Publication No. 2001-308076

Patent Document 4: Japanese Patent Application Laid-Open Publication No. 2003-316019

Patent Document 5: Japanese Patent Application Laid-Open Publication No. 2005-197349

SUMMARY OF THE INVENTION

Problem to be Solved by the Invention

As described in Patent Document 1, it is general that a plurality of tubular excimer lamps are disposed to apply vacuum ultraviolet light to a wafer, which is a sample to be processed, and the wafer is processed. The stability and a variation over time of the light intensity of applied vacuum ultraviolet light were not considered sufficiently.

It is general that the lifetime of the excimer lamp is usually reduced to 75 to 50% of the initial light intensity in lighting for 1,000 to 1,500 hours. Moreover, since the attenuation characteristics of the light intensity of the excimer lamp are varied between individual lamps, in the case of disposing a plurality of tubular excimer lamps as described in Patent Document 1, it is necessary to consider a variation over time of the light intensity as well as a variation over time of wafer in-plane uniformity. However, conventionally, consideration is not sufficiently given to these points.

Under the aforementioned situations, it is shown that the cylindrical excimer lamps and the window are not sufficiently cooled by introducing $N_2$ gas, and it is difficult to suppress a variation over time caused by a temperature rise of synthetic silica. Moreover, in the case of using a plurality of excimer lamps, since a variation over time is varied between the individual excimer lamps, it is also difficult to maintain the uniformity of light intensity applied to a wafer. Furthermore, a long-term variation over time also occurs due to a change in pressure in association with the leakage of a sealed gas or a temperature rise of the wall surface, a change in gas compositions because of a reaction or the like between a tube wall and gas, and a change in the transmission characteristics of vacuum ultraviolet light through the tube wall material of the excimer lamp. Finally, the excimer lamp is usually replaced when the light quantity is a certain light quantity or less. In the case where the excimer lamp is not replaced, the excimer lamp is often not lit at a certain point in time. Therefore, the excimer lamp is a consumable item, causing a problem in that running costs are high.

On the other hand, plasma curing disclosed in Patent Document 2 has an excellent reproducibility of plasma processing and a small variation over time. However, according to the study of the inventors, a change in resist pattern width (CD) after plasma curing, more particularly, a difference in CD change between a coarsely patterned portion and a finely patterned portion, that is, a difference between coarseness and fineness is increased. In other words, it is difficult that in plasma curing, a reduction in resist LWR is not compatible with a reduction in a difference in CD between a coarse portion and a fine portion. In the invention described in Patent Document 2, consideration is not sufficiently given to this point.

As described above, in the conventional VUV light (vacuum ultraviolet light) processing apparatus using an excimer lamp at a wavelength of 200 nm or less or the like, consideration is not sufficiently given to a variation over time of the light intensity of vacuum ultraviolet light applied to a wafer, and there was a problem in that it is difficult to process wafers in excellent reproducibility.

Moreover, in the conventional plasma processing apparatus, wafers can be processed in excellent reproducibility. However, there was a problem in that it is difficult to reduce a difference in CD between a coarse portion and a fine portion.

Furthermore, in the exposure process in the photolithography techniques, the improvement of resolution by shortening the wavelength of exposure light is advancing. Dry exposure and immersion exposure by an ArF (argon fluoride) excimer laser (a wavelength of 193 nm) go mainstream instead of a KrF (krypton fluoride) excimer laser (a wavelength of 248 nm). In future, double patterning techniques and EUV (Extreme Ultra Violet) exposure are scheduled.

In exposure in the photolithography techniques, it is necessary to deliver exposing light to the bottom part of a resist with sufficient intensity. However, an unnecessary portion of a photoresist material is exposed to light due to reflection at a thin film surface or irregular reflection at a step portion or the like, and ununiformity occurs in exposure. In this case, unnecessary roughness occurs on the surface or the side surface of the circuit pattern of the photoresist formed in development.

Moreover, unnecessary roughness is also formed on the surface or the side surface of the resist due to the ununiformity of resist polymer size, the aggregation of polymers, and the ununiformity of acid diffusion in chemical amplification reactions.

Furthermore, in order to meet downscaling, the molecular structures of photoresist materials are improved according to exposure light sources. With this improvement, a reduction in the plasma etching resistance of photoresist mask patterns or the lack of the initial film thickness becomes a new problem.

A reduction in plasma etch resistance or the lack of the initial film thickness causes an increase in the roughness on the line side surface of mask patterns (LER: Line Edge Roughness) or the roughness of line width (LWR: Line Width Roughness). It can be thought that this phenomenon affects semiconductor device characteristics more than ever in accelerating downscaling in future.

Moreover, when a plasma etching apparatus is used to etch under layers of laminated thin films using the photoresist circuit pattern formed with the roughness as a mask, roughness similar to the roughness on the surface or the side surface of the photoresist is also formed on the side surface of the etched under thin films.

It is an object of the present invention to provide a sample processing apparatus using VUV light preferably for use in applying vacuum ultraviolet light to the entire surface of a wafer in excellent reproducibility and processing wafers in excellent reproducibility.

It is another object of the present invention to provide a sample processing apparatus excellent in sample in-plane uniformity.

It is still another object of the present invention to provide a sample processing apparatus that can improve VUV transmittance and efficiently process wafers with VUV light.

Moreover, it is yet another object of the present invention to provide a plasma processing technique that can suppress roughness which occurs on the surface or the side surface of a photoresist film formed on a semiconductor substrate in the process of forming interconnection patterns and can implement highly accurate etching.

Solution to Solve the Problem

In order to address the aforementioned objects, a VUV light processing apparatus according to the present invention includes: a chamber supplied with a plasma generating gas and vacuumized; a plasma generating space supplied with an electromagnetic wave in the chamber, the plasma generating space being formed in an upper part of the chamber; a sample stage provided in a lower part of the chamber to receive a sample thereon; an optical filter unit including a VUV transmission filter disposed between a plasma processing space and the stage, the stage including a sample mounting surface on which the sample be processed is placed, and the optical filter being provided between the sample stage and the plasma generating space to form the plasma processing space, wherein the optical filter unit is configured to enable the processing space to communicate with an atmosphere in the chamber via a section between the stage and the VUV transmission filter. The optical filter has a function to block an ion, an electron, and a radical from entering the processing space.

Advantageous Effects of the Invention

According to the present invention, with the adoption of a plasma light source, there are the effects that it is possible to apply vacuum ultraviolet light to the entire surface of a sample in excellent reproducibility and to process the sample with VUV light (vacuum ultraviolet light) in excellent reproducibility.

Moreover, with the adoption of a plasma light source, it is possible to provide a sample processing apparatus excellent in sample in-plane uniformity.

Furthermore, it is possible to improve VUV transmittance by reducing the plate thickness of the filter as much as possible and to efficiently process wafers with VUV light.

In addition, according to the other features of the present invention, it is possible to suppress roughness that occurs on the surface or the side surface of a photoresist film formed on a semiconductor substrate for implementing highly accurate etching.

DESCRIPTION OF EMBODIMENTS

According to a representative embodiment of the present invention, a sample processing apparatus includes: a chamber connected with a gas supply apparatus and an evacuation apparatus in which pressure inside the chamber can be reduced; a plasma light source that emits VUV light including a wavelength of 200 nm or less, the plasma light source including a plasma generating unit that generates plasma in a plasma generating space in the chamber; a VUV transmission filter provided between the plasma light source and a sample to be processed; the VUV transmission filter transmits VUV light including the wavelength of 200 nm or less and does not transmit electrons, ions, and radicals in the plasma; and the VUV transmission filter has the outer diameter size larger than that of the sample to be processed.

The aforementioned VUV transmission filter is made using synthetic silica, $MgF_2$, $CaF_2$, LiF, sapphire, or the like, for example.

With these configurations, it is possible to provide a VUV (vacuum ultraviolet) processing apparatus preferably for use in applying vacuum ultraviolet light to the entire surface of the sample to be processed in excellent reproducibility and processing the sample to be processed in excellent reproducibility.

In the following, embodiments of the present invention will be described in detail with reference to the drawings.

First Embodiment

A first embodiment of the present invention will be described with reference to FIGS. 1 to 9C.

Figure 1:
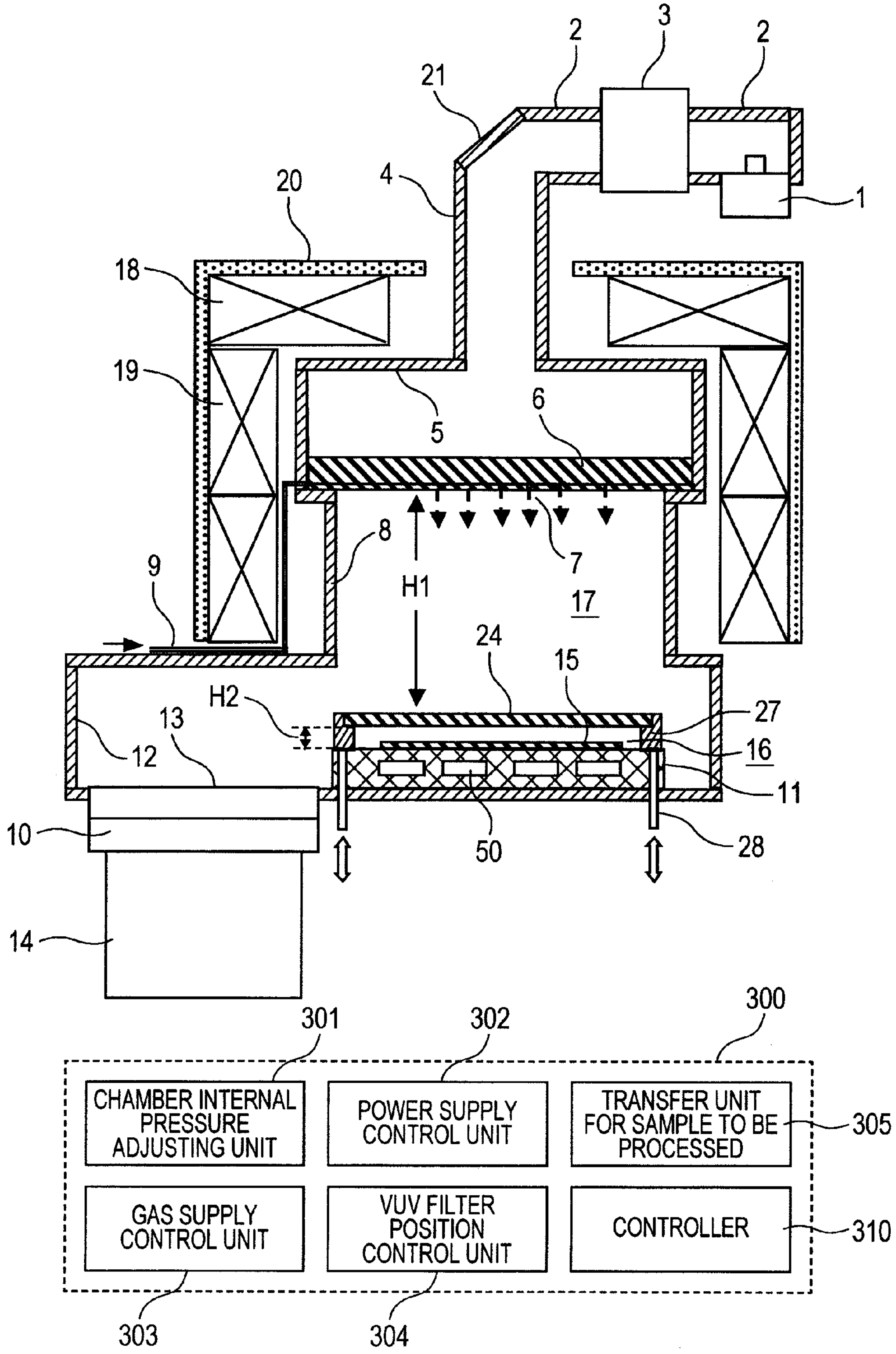
FIG. 1 is a vertical cross sectional view illustrating a sample processing apparatus with VUV light (vacuum ultraviolet light) using an effective magnetic field microwave plasma light source according to a first embodiment of the present invention.

First, FIG. 1 is a vertical cross sectional view illustrating a VUV light processing apparatus using an effective magnetic field microwave plasma light source according to the first embodiment.

In FIG. 1, 1 denotes a magnetron that generates microwaves for generating plasma. The microwaves are introduced into a nearly cylindrical chamber 8 through a rectangular waveguide 2, a matching unit 3, a rectangular-to-circular converter 21, a circular waveguide 4, a cavity resonator 5, and a silica plate 6. 7 denotes a silica shower plate disposed above the chamber 8, and a plasma generating process gas supplied from a gas pipe 9 is supplied to the chamber 8. Moreover, an evacuation apparatus 14 is connected to an exhaust duct 12 of the chamber 8 through an open and close valve 13 and an exhaust velocity variable valve 10. A wafer mounting electrode 11, on which a wafer 15 to be processed is placed, is provided in the lower part of the chamber 8. A VUV light processing space 16 is provided above the wafer mounting electrode 11 so as to cover the entire wafer 15. Namely, the VUV light processing space 16 is formed, which is surrounded by an annular movable side wall 27 disposed at a position to surround the wafer mounting surface of the wafer mounting electrode 11 and an optical filter 24 having the outer edge held on the movable side wall. For the optical filter, a VUV transmission filter 24, for example, is used. A space in the chamber 8 and above the VUV transmission filter 24 is formed in a plasma generating space 17. Coils 18 and 19 and a yoke 20 for forming a magnetic field in the chamber 8 are disposed on the outer side of the chamber 8. Moreover, the VUV transmission filter 24 and the annular movable side wall 27 are moved up and down by a vertical motion mechanism 28.

As described above, the VUV light processing apparatus according to the first embodiment includes the chamber 8 that the pressure inside the chamber can be reduced and the VUV light processing space 16 and the plasma generating space 17 formed in the chamber.

The VUV light processing apparatus according to this embodiment includes a control unit 300 including a computer (this is the same in embodiments below). The control unit 300 includes a chamber internal pressure adjusting unit 301, a power supply control unit 302, a gas supply control unit 303, a VUV transmission filter position control unit 304, a transfer unit 305, a wafer temperature control unit (not illustrated in the drawing), and so on. These units are controlled by a controller 310.

The chamber internal pressure adjusting unit 301 controls the open and close valve 13, the exhaust velocity variable valve 10, and the evacuation apparatus 14, and reduces the pressure inside the chamber 8 to a predetermined vacuum degree.

The power supply control unit 302 controls the magnetron 1 to oscillate a microwave at a frequency of 2.45 GHz, and the microwave is propagated in the rectangular waveguide 2 in a rectangular TE10 mode through an isolator (omitted in the drawing), a power monitor (omitted in the drawing), and the matching unit 3. The microwave is propagated in the circular waveguide 4 in a circular TE11 mode through the rectangular-to-circular converter 21, propagated in the cavity resonator 5, and then enters the plasma generating space 17 through the silica plate 6 and the silica shower plate 7.

The gas supply control unit 303 always supplies a fresh gas into the chamber 8 during wafer processing. Namely, a plasma generating gas controlled by the gas supply control unit 303 passes through the gas pipe 9 through a mass flow controller (omitted in the drawing), passes between the silica plate 6 and the silica shower plate 7, and is introduced into the plasma generating space 17 in the chamber 8 through gas holes in the silica shower plate 7. Moreover, the plasma generating space 17 exists in a magnetic field region generated by the coils 18 and 19 and the yoke 20.

The pressure inside the chamber 8 is adjusted to a desired value using the exhaust velocity variable valve 10 controlled by the chamber internal pressure adjusting unit 301, and then the plasma generating gas introduced into the plasma generating space 17 is turned into plasma by an interaction between the microwave and the magnetic field. This plasma contains VUV light (vacuum ultraviolet light) at a wavelength of 200 nm or more as well as a wavelength of 200 nm or less.

A fresh gas is always supplied in order to generate plasma to be a plasma light source containing VUV light (vacuum ultraviolet light). For a gas to be supplied to the plasma generating space 17, an inert gas such as Ar, Xe, He, Ne, or Kr, a nondepositional gas such as HBr, HCl, $N_2$, $O_2$, $H_2$, $SF_6$, $NF_3$, and a mixed gas of these gases are used. For an example, a magnetic field region at a magnetic flux density of 875 Gausses, in which electron cyclotron resonance (ECR) is generated with a microwave of 2.46 GHz introduced, is formed in the plasma generating space 17. The magnetic field region is formed vertically to the center axis of the plasma generating space 17 and the introducing direction of the microwave and throughout the surface in the cross sectional direction to the center axis of the plasma generating space 17. Plasma, which is mainly generated by an interaction between the microwave of 2.45 GHz and the magnetic field of 875 Gausses, emits VUV light (vacuum ultraviolet light) including a wavelength of 200 nm or less to be a plasma light source.

The VUV transmission filter position control unit 304 has a function to control the vertical motion mechanism 28 for the VUV transmission filter 24, in which the wafer 15 is placed on the wafer mounting electrode 11, and the VUV transmission filter 24 is then lowered to almost seal the region near the wafer 15 for a processing space, thereby roughly forming the VUV light processing space 16. After VUV light processing, the VUV transmission filter 24 is then lifted, and the wafer 15 is brought out.

The transfer unit 305 includes a push-up pin 53 (FIG. 4A) to deliver the wafer 15, a wafer transfer robot (not illustrated in the drawing), and so on. Moreover, a wafer fixing unit using a static vacuum mechanism (omitted in the drawing) or the like is provided on the stage 11.

The wafer temperature control unit has a function to adjust the temperature of the wafer by controlling the circulation of a coolant using a chiller unit (omitted in the drawing) provided on the stage 11, or by controlling a heating and cooling mechanism 50 buried with a heater.

The pressure inside the VUV light processing space 16 is reduced to a low vacuum of about $10^{-3}$ Pa, for example, using the evacuation apparatus 14 as similar to the plasma generating space 17. The VUV transmission filter 24 has an outer diameter size D larger than the outer diameter size of a sample to be processed. For an example, desirably, in the case where the outer diameter of a sample to be processed is 300 mm, the outer diameter D of the VUV transmission filter 24 is about 350 mm, and in the case where the outer diameter of a processed sample is 450 mm, the outer diameter D of the VUV transmission filter 24 is about 500 mm. Moreover, the VUV transmission filter 24 does not transmit electrons, ions, and radicals in plasma, and transmits only photons, that is, VUV light (vacuum ultraviolet light) including a wavelength of 200 nm or less. This VUV transmission filter is made of synthetic silica, $MgF_2$, $CaF_2$, LiF, sapphire, or the like, for example. Thus, only VUV light (vacuum ultraviolet light) from the plasma light source is applied to the sample 15 to be processed, which is located on the stage 11 in the VUV light processing space 16. Furthermore, for the thickness of the VUV transmission filter, in other words, the strength of the VUV transmission filter, it is sufficient that the VUV transmission filter can hold a pressure difference between both surfaces of the VUV transmission filter and the weight of the VUV transmission filter itself at the outer edge.

Namely, the plate thickness of the VUV transmission filter 24 is restricted by the pressure difference between the plasma generating space 17 and the VUV light processing space 16 and the diameter of the VUV transmission filter 24. The smaller the plate thickness of the VUV transmission filter 24 is, the more increased the VUV transmittance of the VUV transmission filter 24 is. In the present invention, since the pressure inside the VUV light processing space 16 is reduced by the same evacuation apparatus 14 for the plasma generating space 17, a pressure difference to act on the upper and lower surfaces of the VUV transmission filter is small. Thus, even though the outer diameter of the wafer is large, it is possible to improve VUV transmittance by reducing the plate thickness of the VUV transmission filter as much as possible and to efficiently process the wafer 15 with VUV light.

It is noted that desirably, a high heat transfer material such as aluminum and ceramics is used for the base material of the annular movable side wall 27, and the outer side of the annular movable side wall 27 is coated or covered with a material such as silica glass that does not tend to be a contamination source due to plasma sputtering or the like. Thus, the heat of the VUV transmission filter received from plasma can be conducted to the stage 11 through the annular movable side wall 27.

The plasma generating space 17 is necessary to have a height H1 enough to generate plasma by electron cyclotron resonance. On the other hand, desirably, a height H2 of the VUV light processing space 16 is reduced as low as possible in a range in which there is no possibility that the VUV transmission filter does not contact with the sample 15 to be processed due to the deformation of the VUV transmission filter, in order to reduce the possibility of entry of electrons, ions, and radicals in plasma from the plasma generating space 17. In the present invention, the amount of deformation of the VUV transmission filter caused by the pressure difference to act on the upper and lower surfaces of the VUV transmission filter is small, which is ignorable. Thus, even though the outer diameter of the wafer or the filter is large, the height H2 of the VUV light processing space 16 can be minute. More specifically, desirably, the height H2 of the VUV light processing space 16 is about 5% of the outer diameter D of the filter or less. The possibility of entry of electrons, ions, and radicals in plasma into the VUV light processing space 16 can be more reduced as the height H2 is made smaller. It is noted that desirably, the lower limit of the height H2 is the height that causes no problem on the operation of the transfer arm of the transfer unit 305. Moreover, desirably, the height H1 ranges from about 300 to 500 mm.

The VUV light (vacuum ultraviolet light) emitted from plasma generated in the aforementioned plasma generating space 17 is varied depending on a gas to be introduced, pressure, microwave output, magnetic field conditions, or the like.

Figure 2:
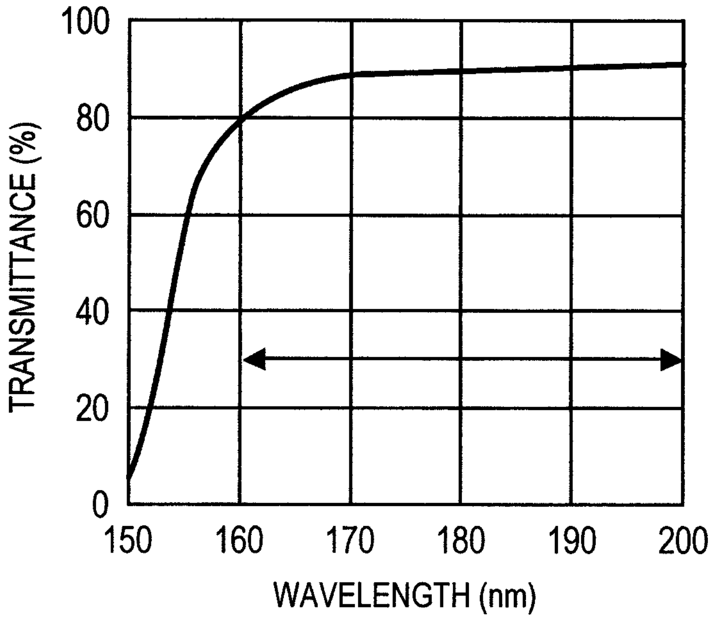
FIG. 2 is a diagram illustrating the transmission characteristics of VUV light (vacuum ultraviolet light) in the case of using synthetic silica for a VUV transmission window (a VUV transmission filter) according to the first embodiment.

FIG. 2 illustrates VUV light (vacuum ultraviolet light) transmission characteristics in the case of using synthetic silica for the VUV transmission filter 24. In this case, roughly, VUV light at a wavelength of 160 nm or more can be transmitted. In future, it is also expected that an optical filter having the lower limit at a wavelength of about 150 nm is developed. The diameter of the VUV transmission filter 24 is larger than the diameter of the wafer 15. Thus, it is possible to apply VUV light (vacuum ultraviolet light) emitted from the plasma generating space and transmitted through the VUV transmission filter 24 to the entire surface of the wafer 15 for VUV light processing.

Figure 3:
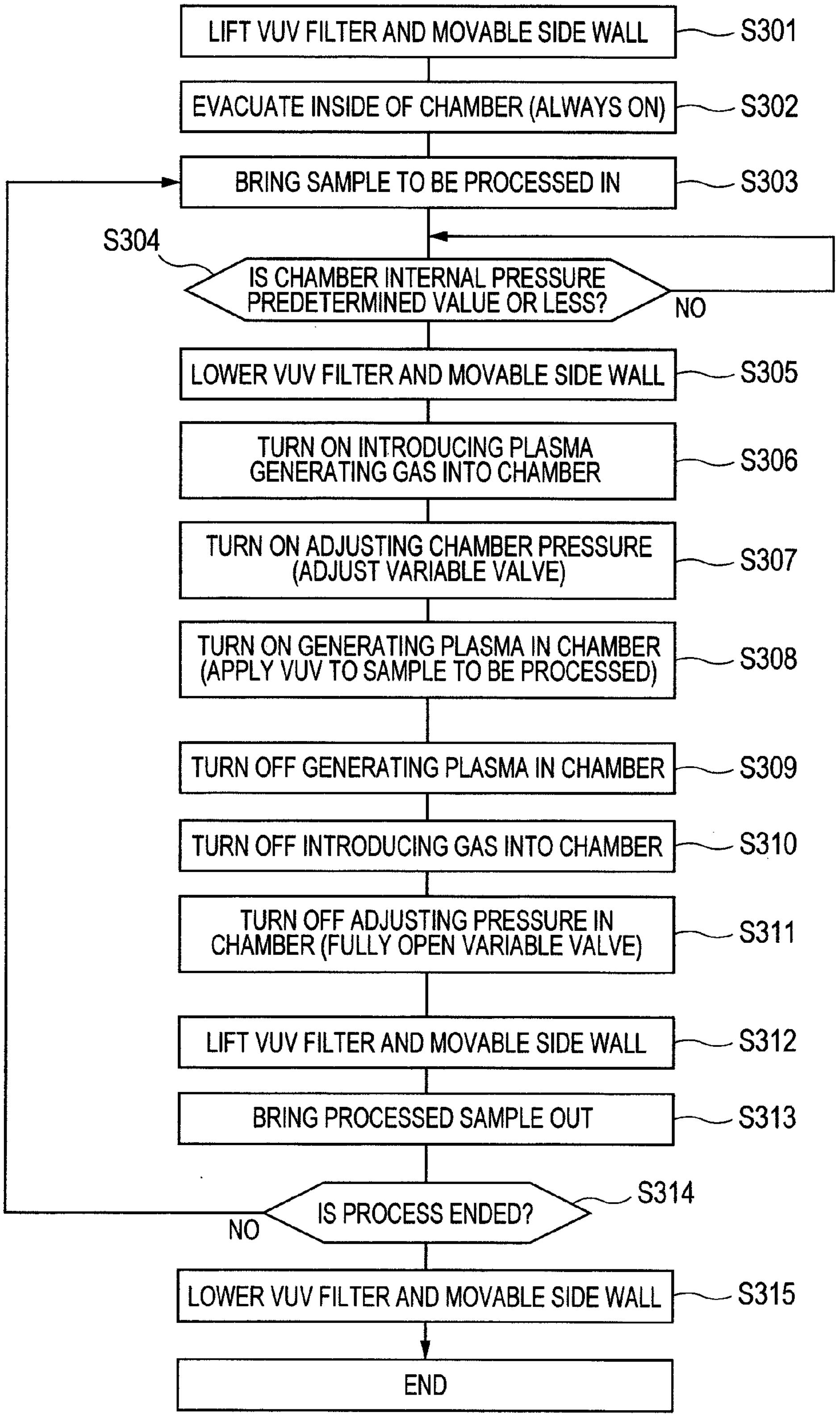
FIG. 3 is a flowchart illustrating control performed by a controller according to the first embodiment.

FIG. 3 is a flowchart illustrating control performed by the controller according to the first embodiment. The operation of the sample processing apparatus according to the first embodiment will be described with reference to FIGS. 4A to 4D.

Figure 4A:
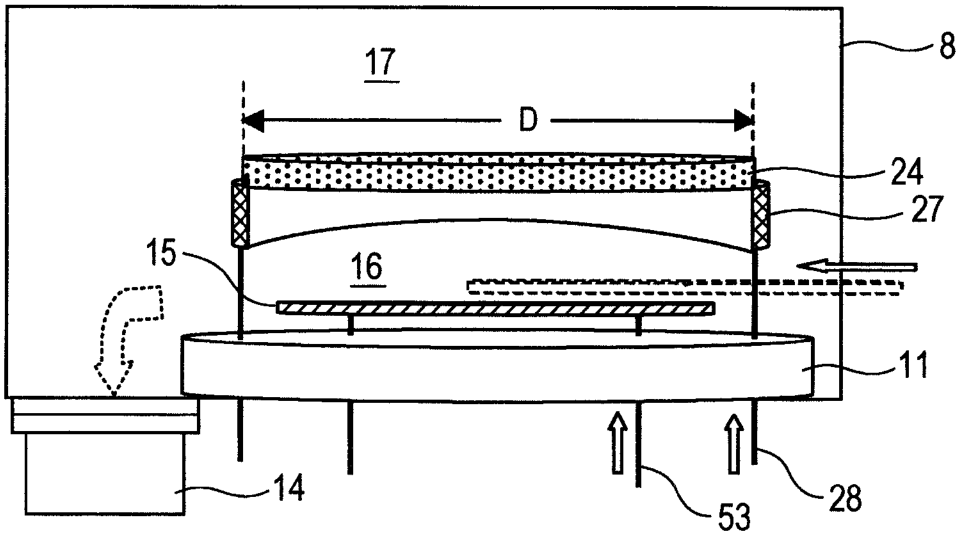
FIG. 4A is a diagram illustrative of the operation of the sample processing apparatus according to the first embodiment.
Figure 4B:
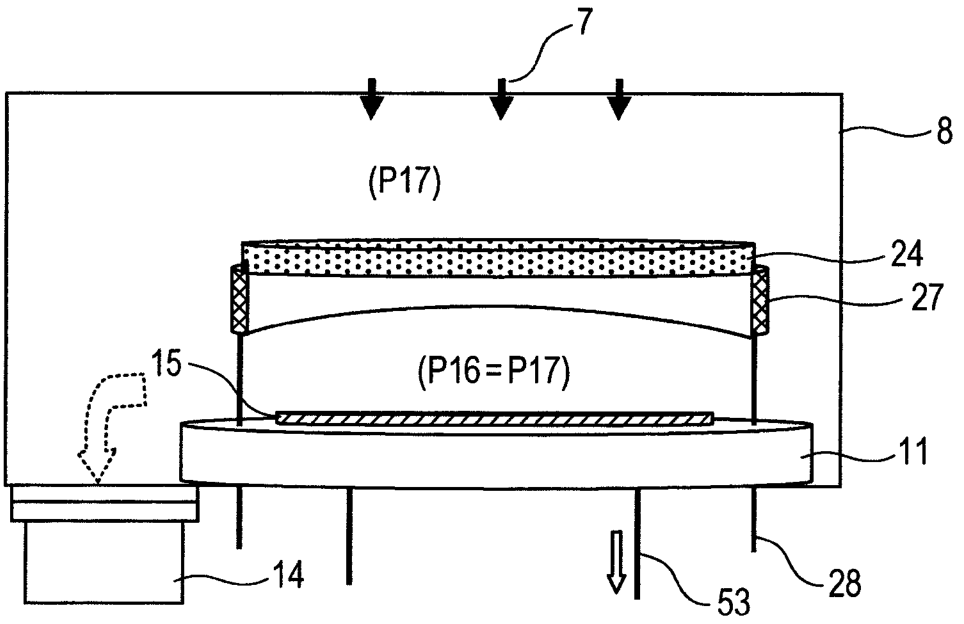
FIG. 4B is a diagram illustrative of the operation of the sample processing apparatus according to the first embodiment.

First, the VUV transmission filter 24 and the annular movable side wall 27 are provided with the vertical motion mechanism 28 to lift the VUV transmission filter 24 and the annular movable side wall 27 to predetermined positions as illustrated in FIG. 4A (S301). The pressure inside the chamber 8 is then reduced to a high vacuum degree of about $10^{-3}$ Pa, for example. Thus, remaining gas and foreign substances in the chamber 8 are discharged (S302). It is noted that this evacuation is continued until the processing of all wafers is completed. Subsequently, one wafer to be processed is brought in the chamber (S303). As illustrated in FIG. 4B, the wafer 15 is placed on the wafer mounting electrode 11, and fixed by electrostatic chucking. It is then confirmed that the pressure inside the chamber 8 is sufficiently reduced to a high vacuum degree of $10^{-3}$ Pa or less, for example (S304). In the state in which the pressure is reduced, the VUV transmission filter 24 and the annular movable side wall 27 are lowered to roughly seal the region near the wafer 15, thereby forming the VUV light processing space 16 (S305). In this formation, the pressures in the VUV light processing space 16 and the plasma generating space 17 are substantially the same pressure (P16=P17). It is noted that the evacuation in the processing space may be continued as similar to the plasma generating space as necessary also after sealing. Subsequently, a plasma generating process gas is introduced into the chamber 8 (S306). The order of steps S305 and S306 may be reversed. Although it is likely that a slight amount of process gas is mixed into the processing space 16, it is sufficient that the magnetic field conditions are controlled so as not to bring the ECR surface in the VUV light processing space 16 for suppressing the generation of plasma in the VUV light processing space.

The exhaust velocity variable valve 10 adjusts the pressure inside the chamber 8 (S307). Thus, the pressure inside the chamber 8 is adjusted to a pressure of about 1 to 10 Pa, for example, suited for generating plasma in the plasma generating space 17.

Figure 4C:
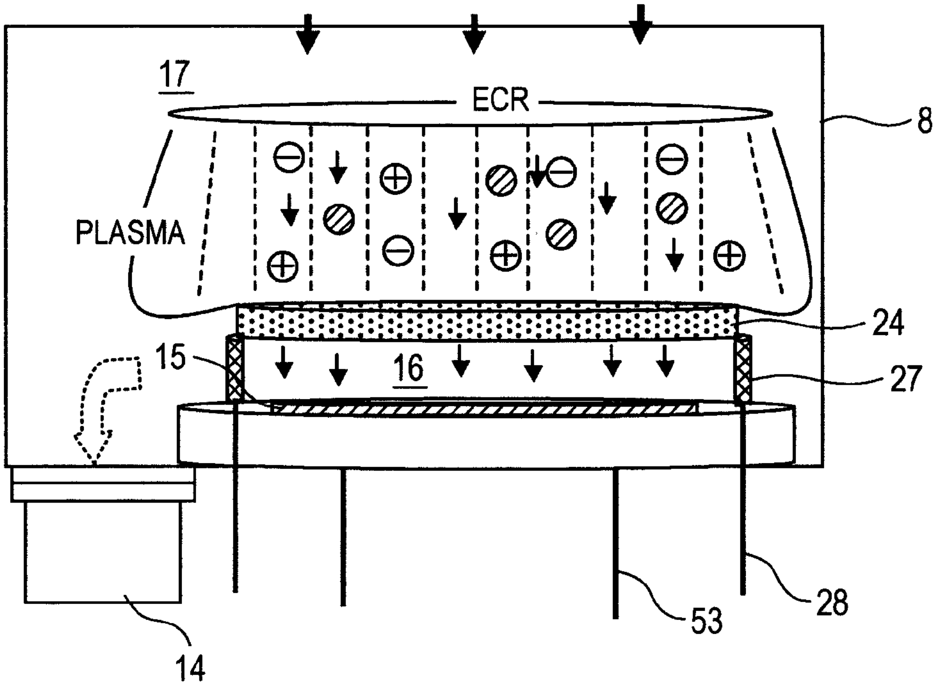
FIG. 4C is a diagram illustrative of the operation of the sample processing apparatus according to the first embodiment.

Subsequently, as illustrated in FIG. 4C, microwaves are supplied into the chamber 8 to generate plasma in the plasma generating space 17 (S308). This plasma is used for a light source, and only VUV light in this plasma light source is applied to the wafer through the VUV transmission filter 24 for curing the wafer. After finishing VUV light processing, generating plasma in the chamber 8 is turned off (S309), and introducing gas into the chamber 8 is also turned off (S310). Moreover, adjusting the pressure inside the chamber is also turned off (the variable valve is fully opened) (S311).

Figure 4D:
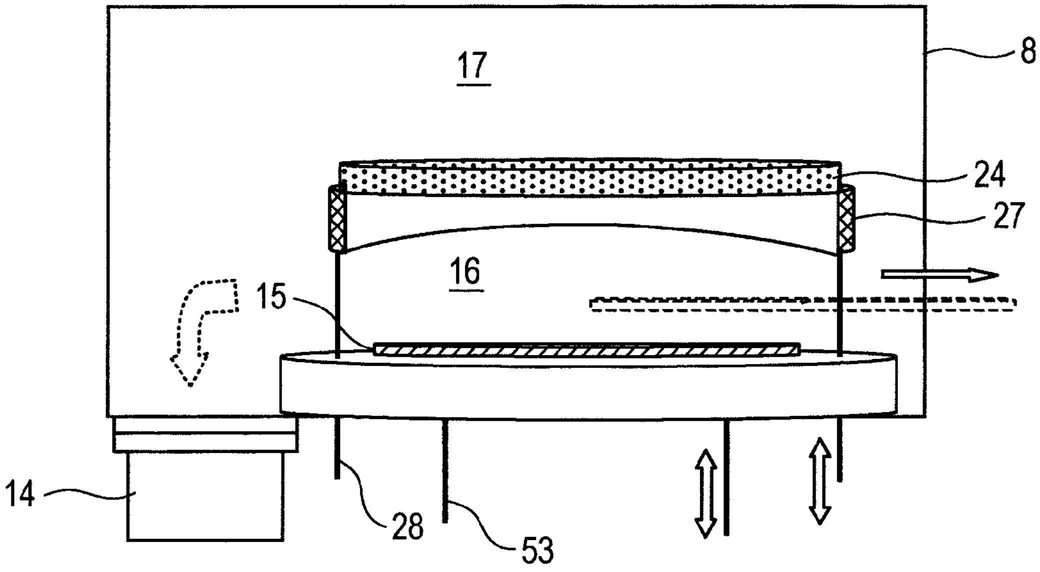
FIG. 4D is a diagram illustrative of the operation of the sample processing apparatus according to the first embodiment.

After processing the wafer with VUV light, as illustrated in FIG. 4D, the VUV transmission filter 24 and the annular movable side wall 27 are lifted between predetermined positions (S312), and the wafer 15 is brought out of the chamber 8 (S313). Subsequently, the similar processes are repeated until the VUV light processing of all wafers to be processed is completed (from S303 to S314). After the completion of VUV light processing, the VUV transmission filter 24 and the annular movable side wall 27 are lowered to the positions in the initial state (S315), and the process is ended.

Figure 5A:
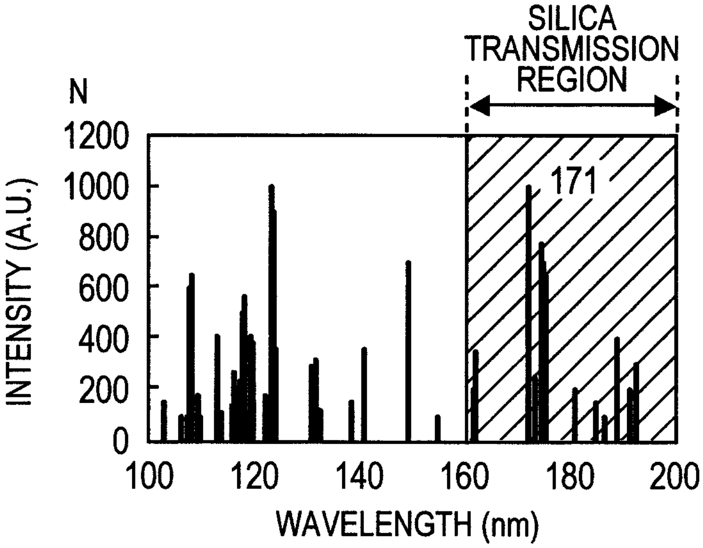
FIG. 5A is a diagram illustrating the VUV spectra of N and Br emitted from $N_2$ that is a plasma generating gas (plotted with reference to the data of NIST, which is a Reference Document).
Figure 5B:
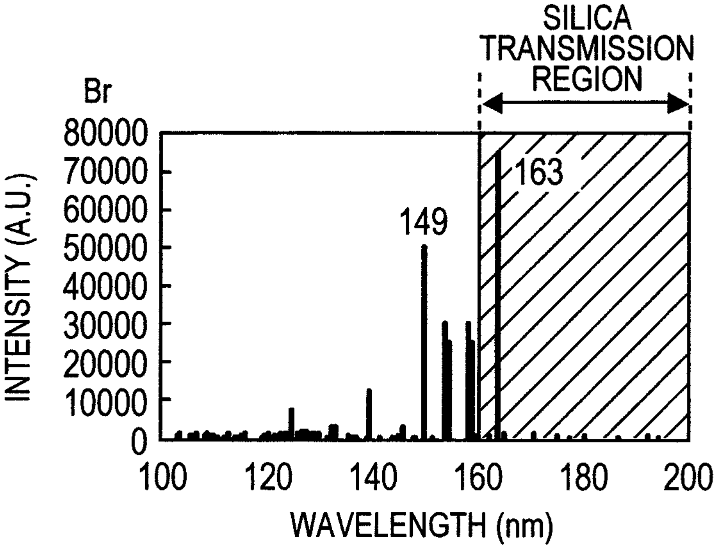
FIG. 5B is a diagram illustrating the VUV spectra of N and Br emitted from HBr that is a plasma generating gas (plotted with reference to the data of NIST, which is a Reference Document).

FIGS. 5A and 5B illustrate the VUV spectra of N and Br emitted using a typical process gas, $N_2$, HBr, or the like (plotted with reference to the numeric value data of NIST, which is a Reference Document). The VUV light in the plasma light source contains various wavelengths. With the VUV transmission filter 24 using synthetic silica, VUV light roughly at wavelengths of 200 to 160 nm can be used for processing.

Moreover, a gas is sealed in a lamp in a conventionally known excimer lamp. However, in the case of the plasma light source according to the present invention, a fresh gas is always stably supplied to the plasma generating space through the mass flow controller (omitted in the drawing) when processing the wafer 15. Thus, there is the effect that it is possible to emit VUV light (vacuum ultraviolet light) in excellent reproducibility and to process the wafer 15 with VUV light in excellent reproducibility.

Furthermore, it is made possible to reduce a difference in CD between a coarse portion and a fine portion using the plasma light source according to the present invention. In the following, this point will be described.

Figure 6:
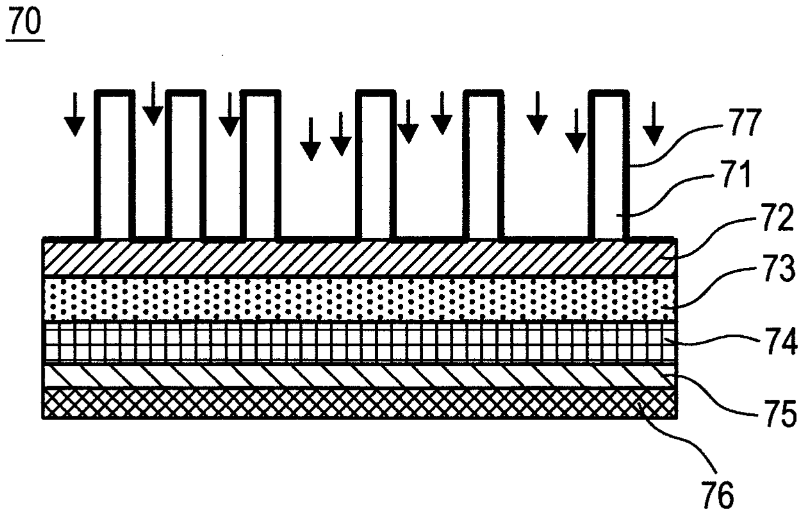
FIG. 6 is a diagram illustrative of the processing situations of VUV curing using a plasma light source according to an embodiment of the present invention.

One of applications of VUV light processing is VUV curing. The aforementioned VUV light (vacuum ultraviolet light) is applied to a patterned resist as a fine patterning mask on the wafer 15. First, the process situations of VUV curing using the plasma light source according to the embodiment of the present invention will be described with reference to FIG. 6. FIG. 6 is a diagram illustrating the cross sectional structure of a sample 70 to be processed (a well known fine gate electrode formed on a semiconductor substrate 76 including an insulating file 75, a conductive layer 74, a mask layer 73, and an anti-reflective film 72 and a photoresist mask pattern 71). According to the present invention, since the VUV transmission filter transmits only photons, there is the effect that it is possible to perform uniform processing to reduce resist LWR, regardless of how coarse or fine the pattern is, even in the case where a fine patterning mask 71 has coarsely patterned portions and finely patterned portions 77 as illustrated in FIG. 6.

Figure 7A:
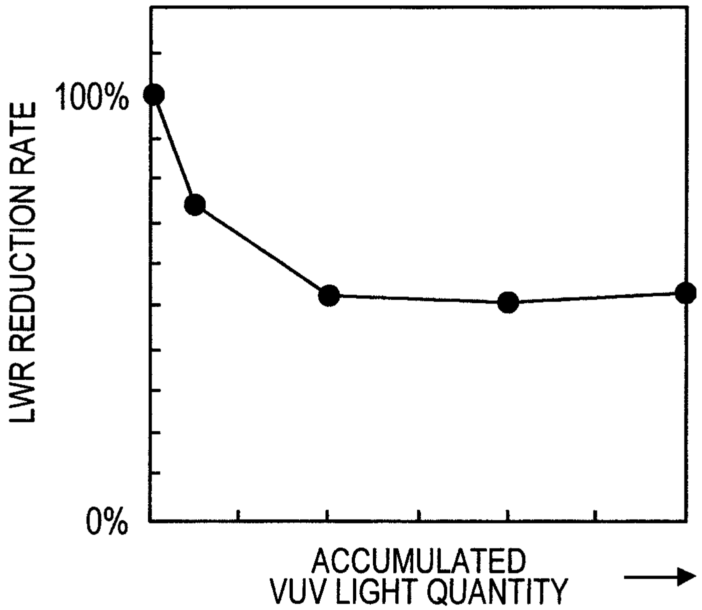
FIG. 7A is a diagram illustrating the relationship between the accumulated light quantity of VUV light and LWR (a change rate from the initial LWR) in VUV curing according to an embodiment of the present invention.
Figure 7B:
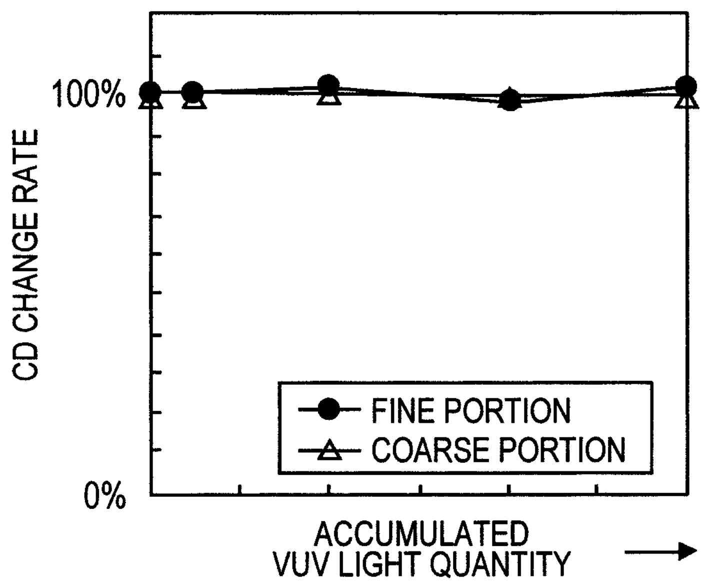
FIG. 7B is a diagram illustrating the relationship between the accumulated light quantity of VUV light and the CD change rates of a coarse portion and a fine portion in VUV curing according to an embodiment of the present invention.
Figure 7C:
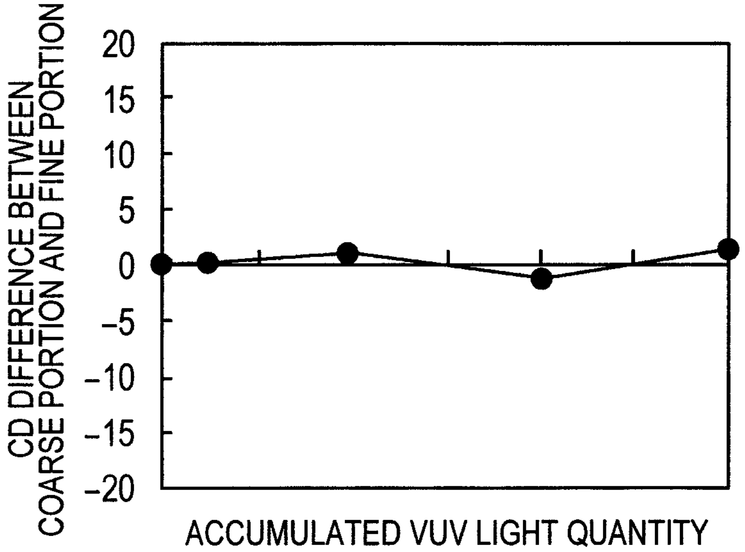
FIG. 7C is a diagram illustrating the relationship between the accumulated light quantity of VUV light and a difference in CD between a coarse portion and a fine portion according to an embodiment of the present invention based on data in FIG. 7B.

FIG. 7A illustrates the relationship between the accumulated light quantity of VUV light and LWR (a change rate from the initial LWR) in the present invention. Moreover, FIG. 7B illustrates the relationship between the accumulated light quantity of VUV light and the CD change rates of a coarsely patterned portion and a finely patterned portion. Furthermore, FIG. 7C illustrates the relationship between the accumulated light quantity of VUV light and a difference in CD between a coarse portion and a fine portion in the embodiment of the present invention based on data in FIG. 7B.

As illustrated in FIG. 7A, it is revealed that the resist LWR is suddenly reduced upon applying VUV light and reduced to 50% of the initial LWR. Moreover, it is apparent from FIGS. 7B and 7C that the present invention exerts the effect of suppressing a pattern CD difference between a coarse portion and a fine portion.

Moreover, in the case of the plasma processing apparatus according to the present invention, a gas is introduced during plasma processing, and the pressure inside the VUV light processing space is adjusted to be constant for evacuating the gas. Thus, the reproducibility of plasma processing is excellent, and a variation over time is small.

Figure 8:
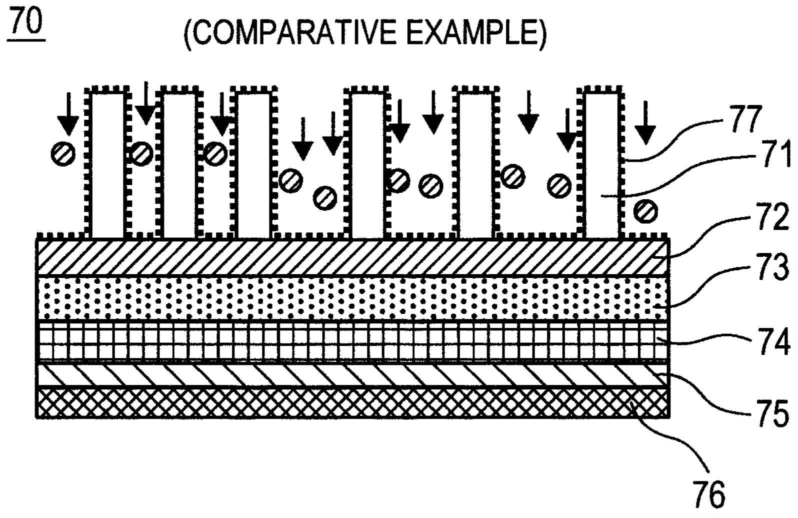
FIG. 8 is a diagram illustrative of the processing situations of VUV curing using a plasma light source according to a comparative example.
Figure 9A:
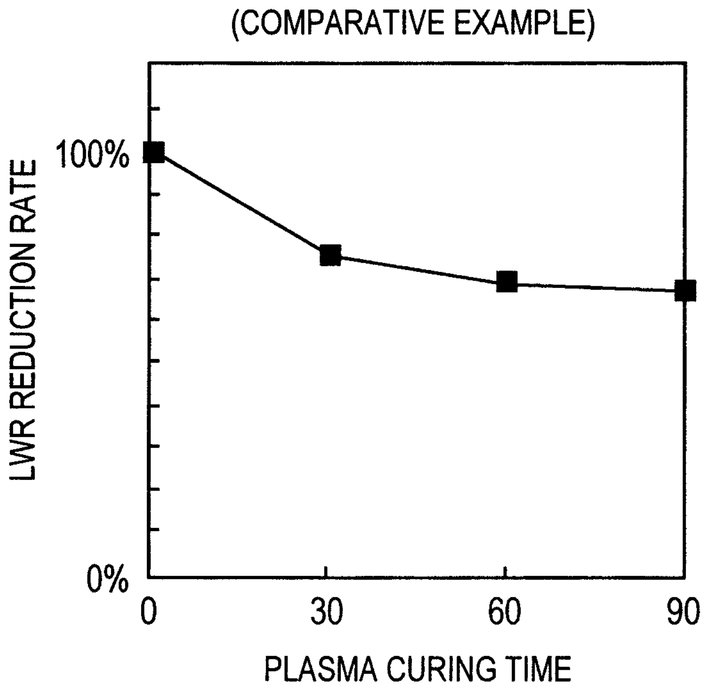
FIG. 9A is a diagram illustrating the relationship between plasma curing time and a resist LWR reduction rate in plasma curing according to the comparative example.
Figure 9B:
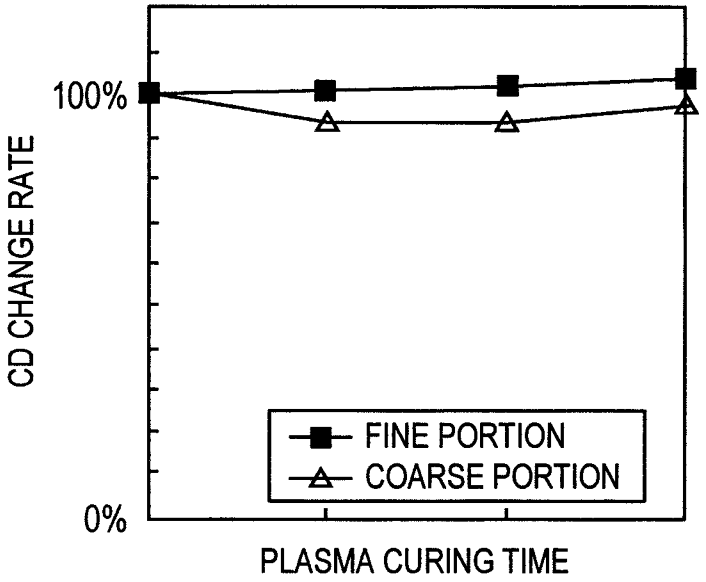
FIG. 9B is a diagram illustrating the relationship between plasma curing time and the CD change rates of a coarse portion and a fine portion according to the comparative example.
Figure 9C:
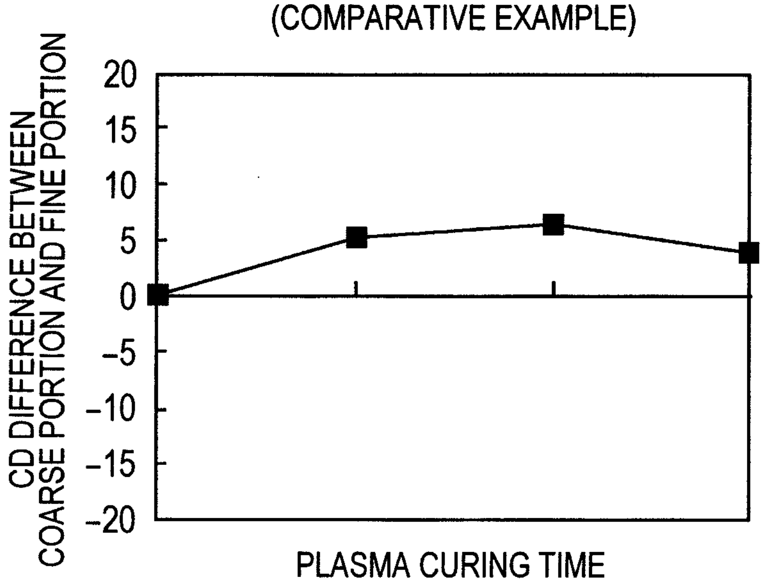
FIG. 9C is a diagram illustrating the relationship between plasma curing time and a difference in CD between a coarse portion and a fine portion according to the comparative example based on data in FIG. 9B.

For a comparative example, the process situations of VUV curing using a plasma light source without a VUV transmission filter will be described with reference to FIG. 8. Moreover, FIG. 9A illustrates the relationship between plasma curing time and a resist LWR reduction rate in plasma curing. FIG. 9B illustrates the relationship between plasma curing time and the CD change rates of a coarse portion and a fine portion. FIG. 9C illustrates the relationship between plasma curing time and a CD difference between a coarse portion and a fine portion based on data in FIG. 9B. As illustrated in FIG. 9A, although the effect of reducing resist LWR is obtained by plasma curing, a difference in CD between a coarse portion and a fine portion is increased. According to a result studied by the inventors, this is because a factor can be considered that probabilities are different between a coarsely patterned portion and a finely patterned portion to which radicals generated by plasma enter as illustrated in FIG. 8.

According to the present invention, as illustrated in FIGS. 7B and 7C, in the case of VUV curing, there is the effect that a CD difference between a coarse portion and a fine portion does not occur because CD does not change in both a coarsely patterned portion and a finely patterned portion by VUV application. Moreover, there is no difference in CD between a coarse portion and a fine portion, and resist LWR can be reduced. Thus, in the case where a resist after VUV curing is used as a mask to etch a base film (BARC, SiON, amorphous carbon, spin-on carbon, $SiO_2$, SiN, poly-Si, metal material, a Si substrate, or the like, for example) after VUV application, there is a merit that it is possible to reduce LWR after processed and to reduce a difference in CD between a coarse portion and a fine portion.

In the example described above, a dry ArF resist and an immersion ArF resist were used for a resist. The similar effect was confirmed also in an EUV resist used for much finer patterning. Particularly in the EUV resist, since the ratio of LWR to CD is large because of downscaling, a reduction in LWR by VUV curing is significantly useful. This is because a reduction in LWR relates to a reduction in fluctuations of electrical characteristics of a device after etched.

VUV curing is that VUV light (vacuum ultraviolet light) is applied to an ArF resist or the like to dissociate, split, and desorb a carbonyl group, a lactone group, or the like for changing the structure of the resist, and micro reflow is generated on the resist surface for smoothing the resist surface. This is a so-called photochemical reaction, and wafer temperature is also an important parameter. Particularly, the glass transition temperature of the resist relates to softening the resist and micro reflow. Thus, as illustrated in FIG. 1, there is the effect that increases LWR reducing effect or that improves the reproducibility of wafer processing by controlling wafer temperature using the wafer temperature control unit such as the heating and cooling mechanism 50 provided on the wafer mounting electrode 11.

As described above, according to the present invention, with the adoption of the plasma light source, there are the effects that it is possible to apply vacuum ultraviolet light to the entire surface of the sample in excellent reproducibility and to process the sample with VUV light (vacuum ultraviolet light) in excellent reproducibility. Moreover, with the adoption of the plasma light source, it is possible to provide a sample processing apparatus excellent in sample in-plane uniformity.

Furthermore, according to the present invention, since the inside of the chamber is vacuumized in a state in which the VUV light processing space is communicated with the plasma generating space, it is possible to reduce a pressure difference between the plasma generating space and the VUV light processing space in the process of evacuation or the like, and it is possible to secure necessary strength even though the plate thickness of the VUV transmission filter is reduced. Thus, there are the effects that the plate thickness of the VUV transmission filter is thin even though the outer diameter of the wafer is large, that VUV light (vacuum ultraviolet light) transmitted through the VUV transmission filter is increased, and that the VUV light processing velocity of the wafer is increased.

Second Embodiment

In the first embodiment, the VUV light processing space 16 is vacuumized for VUV light processing. However, a gas that does not absorb VUV light such as $N_2$ and a noble gas, for example, may be introduced as a second gas into the VUV light processing space 16 from the gas inlet port 26 through the mass flow controller (omitted in the drawing) for processing.

Figure 10A:
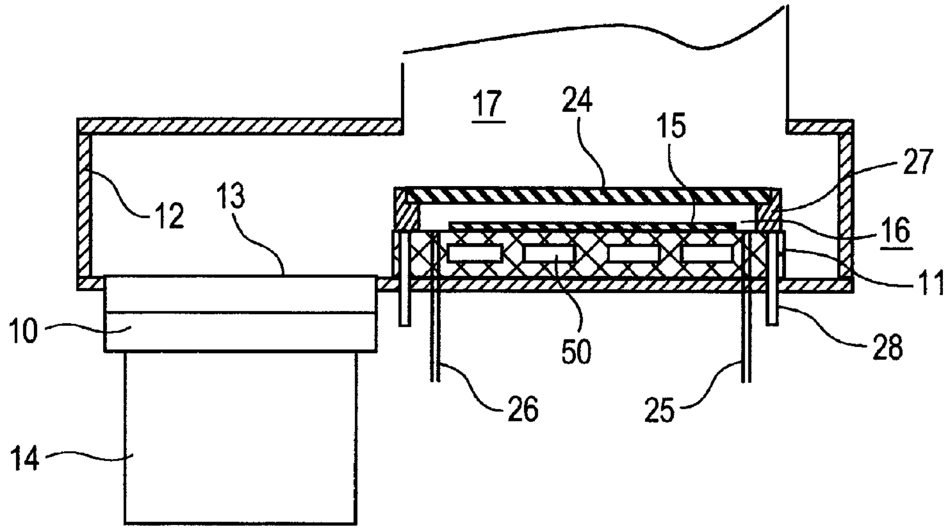
FIG. 10A is a vertical cross sectional view illustrating the essential part of a sample processing apparatus with VUV light (vacuum ultraviolet light) using an effective magnetic field microwave plasma light source according to a second embodiment of the present invention.
Figure 10B:
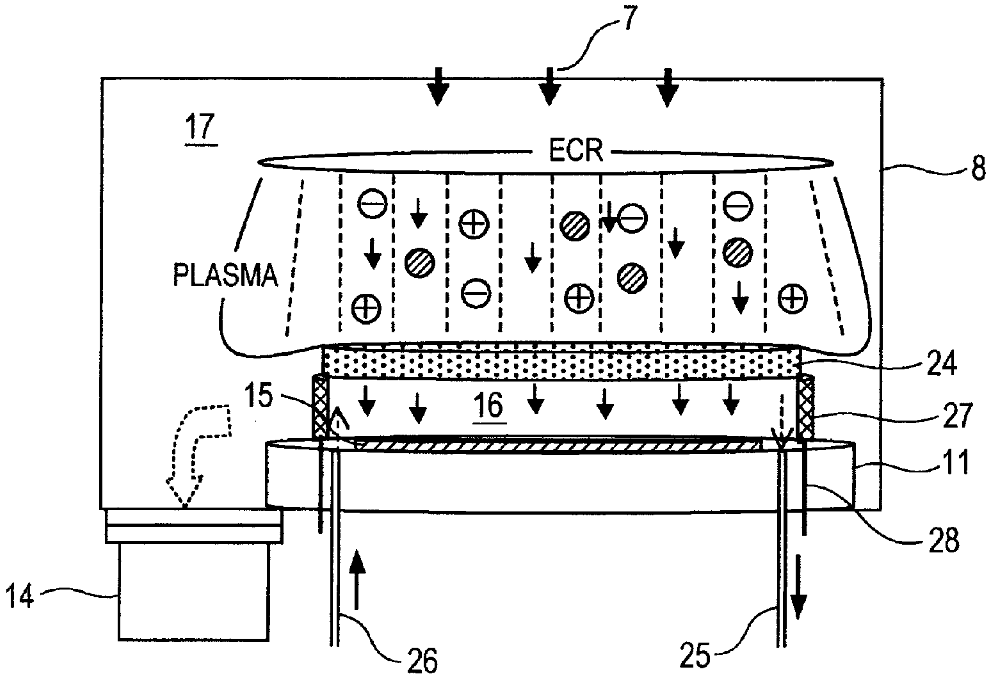
FIG. 10B is a diagram illustrative of the operation of the sample processing apparatus according to the second embodiment.

A second embodiment of the present invention will be described with reference to FIGS. 10A and 10B. A gas inlet port 26 and a gas outlet port 25 are provided in order to supply a second gas into a region near the outer rim of the wafer 15 in the processing space 16. It is sufficient that the timing of supplying the second gas into the VUV light processing space 16 is almost the same as the timing at which a plasma generating process gas is introduced into the chamber 8 (S306 in FIG. 3), and the introduction of the gas is stopped (S310).

In the case where the second gas is $N_2$, the VUV light processing effect almost similar to the VUV light processing effect in a vacuum can be obtained. In this case, the pressure inside the VUV light processing space 16 may be adjusted using the vacuum pump 14 and the exhaust velocity variable valve 10. Namely, the pressure inside the VUV light processing space 16 may be adjusted as similar to adjusting the pressure inside the chamber 8 (S307 and S311 in FIG. 3). In the case of providing a simple configuration, such a structure may be possible in which the introduced gas is discharged from a gas outlet port (omitted in the drawing) without the vacuum pump 14 and the exhaust velocity variable valve 10.

Moreover, desirably, a pressure adjusting mechanism (omitted in the drawing) is provided so as to minimize a pressure difference between the plasma generating space 17 and the VUV light processing space 16. As described above, the plate thickness of the VUV transmission filter 24 is restricted by the pressure difference between the plasma generating space 17 and the VUV light processing space 16 and the diameter of the VUV transmission filter 24. The VUV transmittance of the VUV transmission filter 24 is more increased as the plate thickness of the VUV transmission filter 24 is smaller, so that it is possible to efficiently process the wafer 15 with VUV light.

Furthermore, such a configuration may be possible in which a reactive gas (a process gas) such as $SF_6$, $Cl_2$, HBr, $O_2$, or $CF_4$ is introduced into the VUV light processing space 16 from the gas inlet port 26 through a mass flow controller (omitted in the drawing) and the pressure inside the VUV light processing space 16 is adjusted using the vacuum pump 14 and the exhaust velocity variable valve 10 for processing the wafer 15. In this case, VUV light (vacuum ultraviolet light) is applied to cause the molecules of the reactive gas to be excited or dissociated for a photo excited state reaction with the wafer 15, or alternatively, the molecules of the reactive gas are attached to the surface of the wafer 15, and VUV light (vacuum ultraviolet light) is applied to the attached molecules for a photo surface excited state reaction, whereby the wafer 15 can be processed.

According to this embodiment, with the adoption of the plasma light source, it is possible to apply vacuum ultraviolet light to the entire surface of the sample in excellent reproducibility and to process the sample with VUV light in excellent reproducibility. Moreover, with the adoption of the plasma light source, it is possible to provide a sample processing apparatus excellent in sample in-plane uniformity. Furthermore, it is possible to improve VUV transmittance by reducing the plate thickness of the filter as much as possible and to efficiently process wafers with VUV light.

For the application of this embodiment, there is resist trimming in which the resist CD (the pattern critical dimension) is narrowed to a desired value while reducing resist LWR.

Third Embodiment

A third embodiment of the present invention will be described with reference to FIGS. 11 and 12.

In this embodiment, the VUV transmission filter 24 and a thin, ring-shaped filter holder 54 are disposed right above the wafer 15, instead of covering the region around the wafer 15 with the VUV transmission filter 24 and the annular movable side wall 27 in the first embodiment illustrated in FIG. 1. Since the filter holder 54 and the vertical motion mechanism 28 are exposed to plasma, desirably, a high heat transfer material such as aluminum and ceramics is used for the base material of the filter holder 54 and the vertical motion mechanism 28, and the outer side of the filter holder 54 and the vertical motion mechanism 28 is coated or covered with a material such as silica glass that does not tend to be a contamination source due to plasma sputtering or the like.

Although the point in that the positions of the VUV transmission filter 24 and the filter holder 54 are controlled by the vertical motion mechanism 28 of the VUV transmission filter position control unit 304 is the same as in the first embodiment, the second embodiment is different in that the plasma generating space 17 and the VUV light processing space 16 are two spaces always in a communicating state. As same as the second embodiment, a gas inlet port 26 and a gas outlet port 25 are provided.

It is noted that desirably, the height H2 of the VUV light processing space 16 is about 5% of the outer diameter D of the filter or less as similar to the first embodiment. The possibility of entry of electrons, ions, and radicals in plasma into the VUV light processing space 16 can be more reduced as the height H2 is made smaller.

Figure 12:
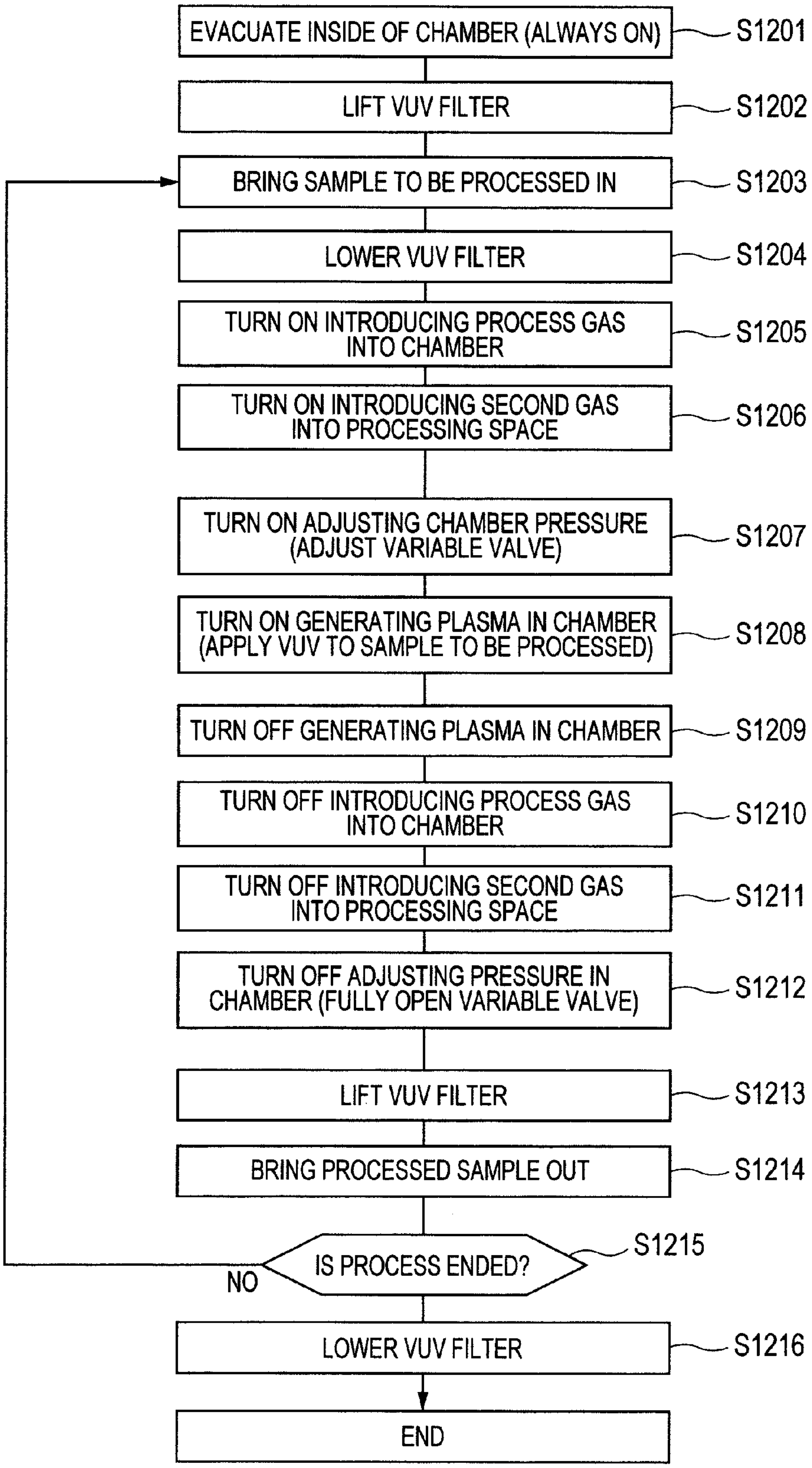
FIG. 12 is a flowchart illustrating control performed by a controller according to the third embodiment.

FIG. 12 is a flowchart illustrating control performed by a controller according to the third embodiment. In the following, the operation of a sample processing apparatus according to this embodiment will be described.

First, the inside of a chamber is evacuated (S1201). This evacuation is continued until the processing of all wafers is completed. The filter holder 54 is provided with the vertical motion mechanism 28 to lift the VUV transmission filter 24 to a predetermined position (S1202). As different from the first embodiment, since the processing space 16 and the plasma space 17 are not isolated from each other in starting processing, the timing of starting the first evacuation is not restricted by the position of the VUV transmission filter 24. Subsequently, a wafer is then brought in the chamber (S1203), and the wafer 15 is placed on a wafer mounting electrode 11. Then, in a state in which the pressure inside the chamber 8 is sufficiently reduced, the vertical motion mechanism 28 lowers the VUV transmission filter 24 to form the upper space of the region near the wafer 15 to be the VUV light processing space 16. The pressures in the VUV light processing space 16 and the plasma generating space are the same pressure. Subsequently, a plasma generating process gas is introduced into the chamber (S1205). In order to suppress the entry of radicals or the like from the plasma generating space 17, a third gas is introduced into the region around the wafer in the processing space 16 (S1206). The pressure inside the chamber 8 is adjusted using a variable valve (S1207). Subsequently, microwaves are supplied into the chamber 8 to generate plasma (S1208). VUV light in this plasma is applied to the wafer for curing the wafer. After finishing VUV light processing, generating plasma in the chamber is turned off (S1209), and introducing the process gas into the chamber is also turned off (S1210). Moreover, introducing the third gas is turned off (S1211), and adjusting the pressure inside the chamber is also turned off (the variable valve is fully opened) (S1212).

After VUV light processing, the vertical motion mechanism 28 lifts the VUV transmission filter 24 to a predetermined position (S1213), and the wafer 15 is brought out (S1214). Subsequently, the similar processes are repeated until the VUV light processing of all wafers to be processed is completed (S1203 to S1215). After the completion of VUV light processing, the VUV transmission filter 24 and the filter holder 54 are lowered to the positions in the initial state (S1216), and the process is ended.

In this embodiment, since the plasma generating space 17 communicates with the VUV light processing space 16, it is possible to reduce a pressure difference between the two spaces 16 and 17, exerting the similar effect as in the first and second embodiments.

Moreover, introducing a gas such as $N_2$ and a noble gas that does not transmit VUV light from the gas inlet port 26 near the wafer 15 can suppress the entry of radicals that are generated in the plasma generating space 17 into the VUV light processing space 16. Thus, there is the effect that it is possible to suppress the pattern CD difference between a coarse portion and a fine portion caused by plasma curing described above.

It is noted that the VUV transmission filter 24 may be exchanged using a wafer transfer robot (omitted in the drawing) or the like. Alternatively, a holder (omitted in the drawing) that can hold a plurality of the VUV transmission filters 24 therein may be disposed to exchange the VUV transmission filter 24. These methods make the VUV transmission filter 24 exchangeable, whereby the VUV transmission filter 24 can be exchanged without exposing the VUV transmission filter 24 to air even in the case where the VUV light transmission characteristics are degraded due to the contamination or the like of the VUV transmission filter 24. Thus, there is the effect that it is possible to improve throughput and to process the wafer 15 with VUV light in excellent reproducibility.

Fourth Embodiment

Figure 13:
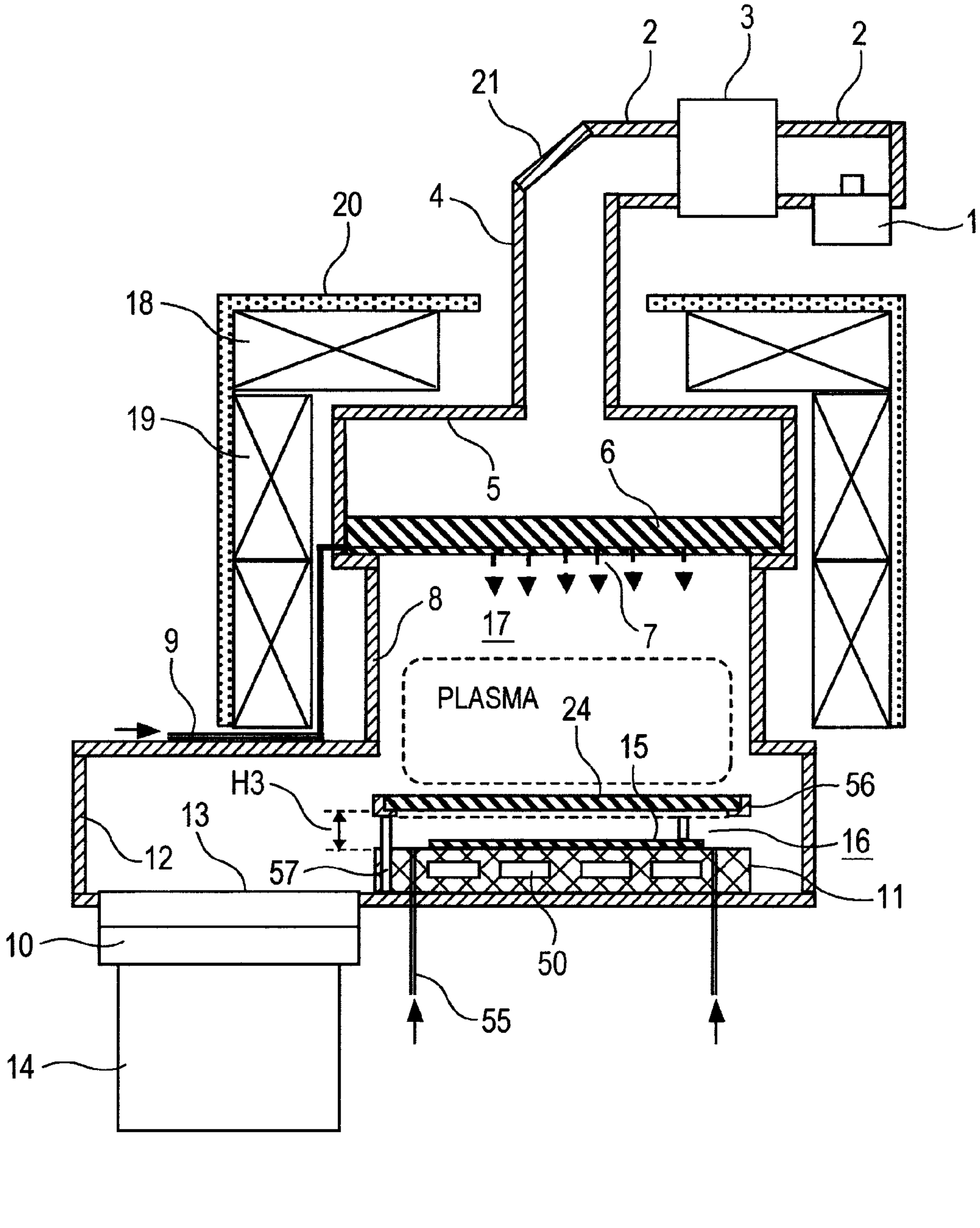
FIG. 13 is a vertical cross sectional view illustrating a VUV (Vacuum Ultraviolet light) processing apparatus using an effective magnetic field microwave plasma light source according to a fourth embodiment of the present invention.

A fourth embodiment of the present invention will be described with reference to FIG. 13.

In the third embodiment, in the case where the distance between the VUV transmission filter 24 and the wafer mounting electrode 11 is sufficient for a wafer transfer robot or the like to place, bring out, and so on the wafer 15, the vertical motion mechanism 28 for the VUV transmission filter 24 may be omitted. Namely, in the case where a distance H3 (corresponding to the upper limit of H2) between the VUV transmission filter 24 and the wafer mounting electrode 11 is the height sufficient for the wafer transfer robot or the like to place, bring out, and so on the wafer 15, such a configuration may be possible in which a thin, ring-shaped filter holder 56 is fixed to the wafer mounting electrode 11 using a plurality of narrow poles 57 and the vertical motion mechanism 28 for the VUV transmission filter 24 is omitted. It is without saying that the positions of the poles 57 are positions to cause no problem to bring in and out the wafer 15. Since the filter holder 56 and the vertical motion mechanism 28 are exposed to plasma, desirably, a high heat transfer material such as aluminum and ceramics is used for the base material of the filter holder 56 and the vertical motion mechanism 28, and the outer side of the filter holder 56 and the vertical motion mechanism 28 is coated or covered with a material such as silica glass that does not tend to be a contamination source due to plasma sputtering or the like.

The operation of this embodiment is as the flowchart of the third embodiment except that the vertical motion mechanism 28 moves up and down the VUV transmission filter 24.

Also in this embodiment, with the adoption of the plasma light source, it is possible to apply vacuum ultraviolet light to the entire surface of the sample in excellent reproducibility and to process the sample with VUV light in excellent reproducibility. Moreover, with the adoption of the plasma light source, it is possible to provide a sample processing apparatus excellent in sample in-plane uniformity. Furthermore, it is possible to improve VUV transmittance by reducing the plate thickness of the filter as much as possible and to efficiently process wafers with VUV light.

Fifth Embodiment

A fifth embodiment of the present invention will be described with reference to FIGS. 14A and 14B.

Figure 11:
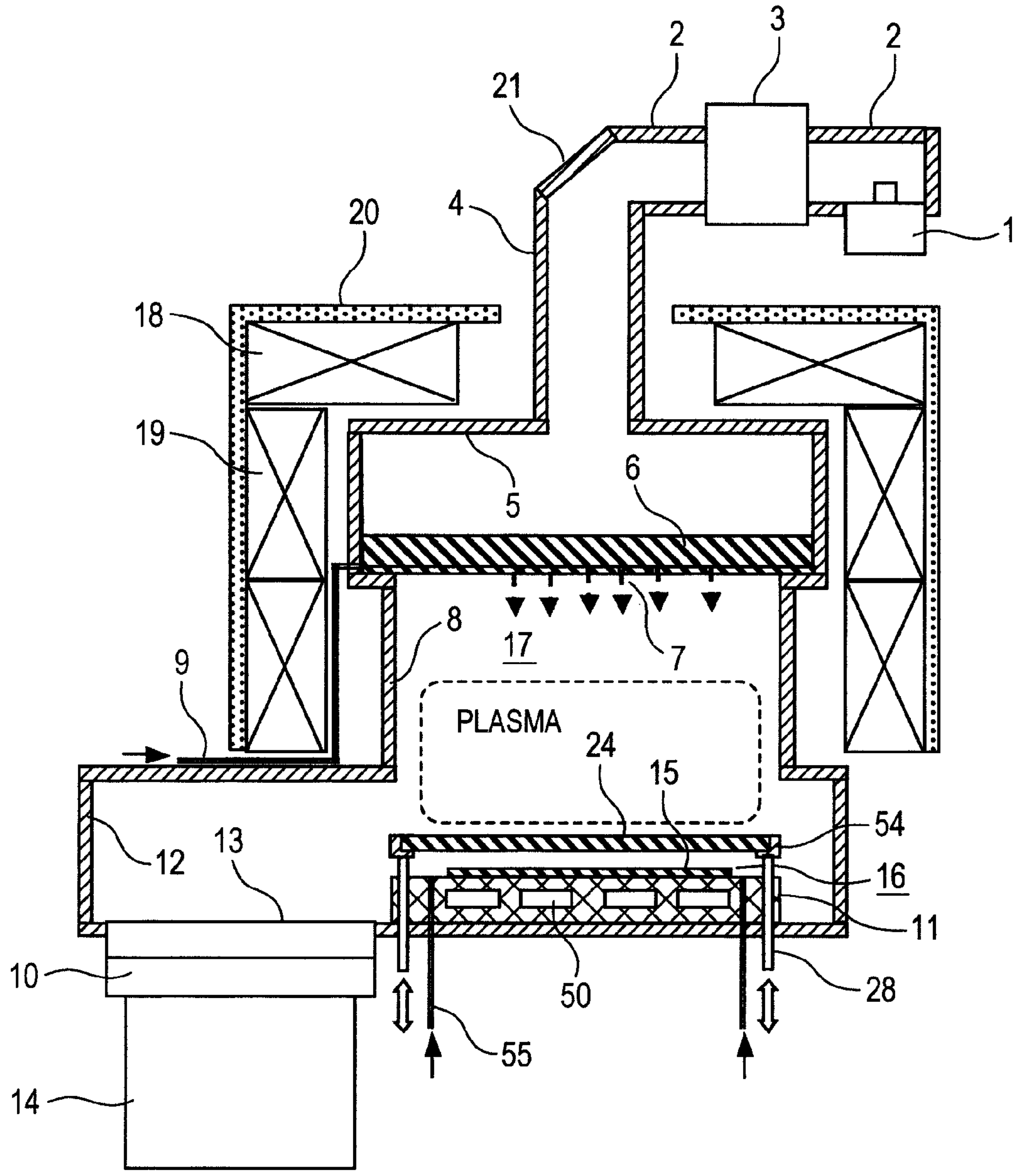
FIG. 11 is a vertical cross sectional view illustrating a sample processing apparatus with VUV light (vacuum ultraviolet light) using an effective magnetic field microwave plasma light source according to a third embodiment of the present invention.
Figure 14A:
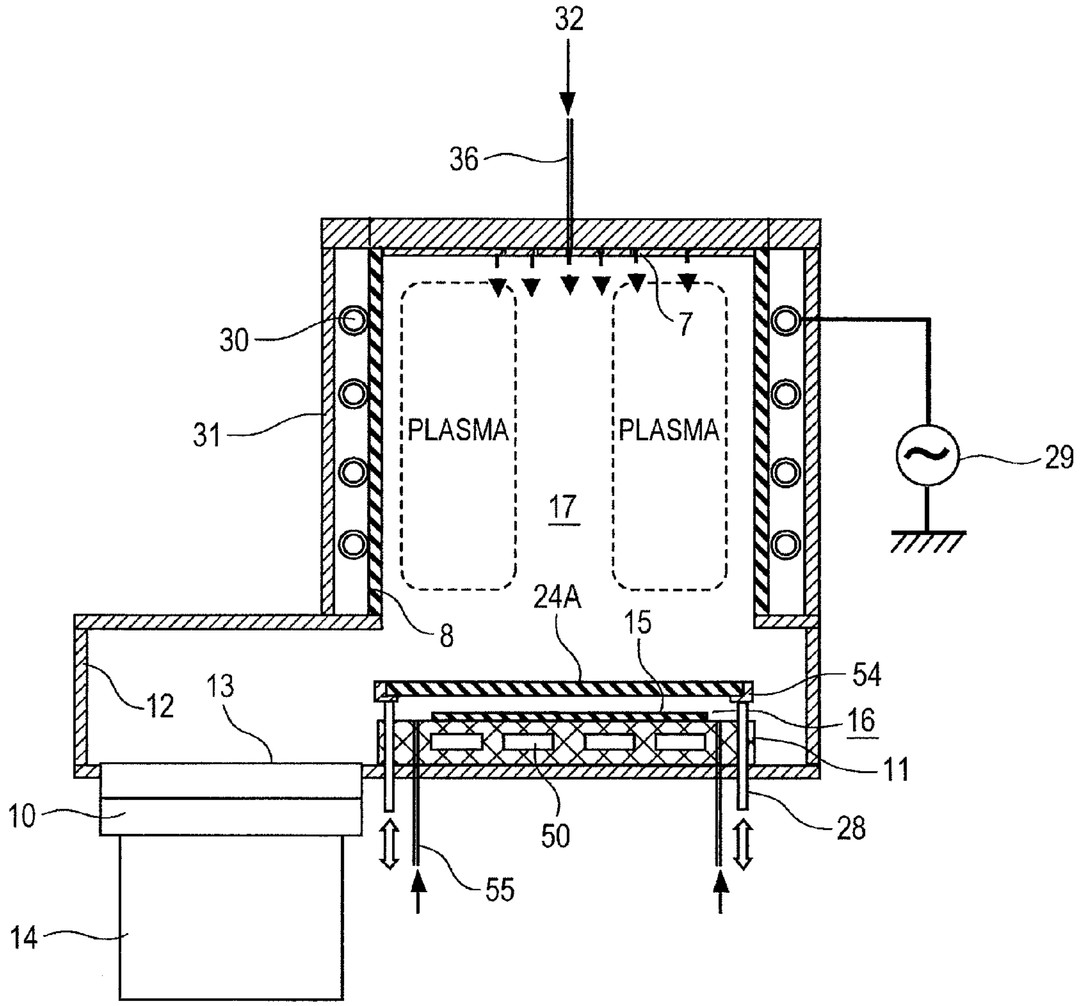
FIG. 14A is a vertical cross sectional view illustrating a VUV (Vacuum Ultraviolet light) processing apparatus using a cylindrical inductively coupled plasma (ICP) light source according to a fifth embodiment of the present invention.
Figure 14B:
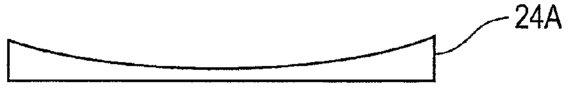
FIG. 14B is a vertical cross sectional view illustrating a VUV transmission filter including a VUV light intensity distribution correcting function according to the fifth embodiment of the present invention.

This embodiment uses a cylindrical inductively coupled plasma (ICP) source as illustrated in FIG. 14A, instead of using the effective magnetic field microwave plasma source for the plasma light source in the third embodiment illustrated in FIG. 11. In FIG. 14A, 29 denotes a high frequency power supply, 30 denotes a high frequency coil, 31 denotes a shield cover, 32 denotes a processing gas supply source, and 36 denotes a gas pipe. In a nearly cylindrical chamber 8 that the pressure inside the chamber can be reduced, there are the plasma generating space 17 and the VUV light processing space 16 located therebelow, and a VUV transmission filter 24A is disposed between the two spaces. The configuration of the VUV light processing space 16 is the same as in the third embodiment.

Also in this embodiment, there are the similar effect and operation as in the third embodiment.

It is noted that in this embodiment, the VUV light intensity distribution of the plasma light source tends to be concave. Thus, it is sufficient that the longitudinal section of the VUV transmission filter 24A is also formed in a concave shape as illustrated in FIG. 14B. Therefore, there is the effect that the VUV light intensity distribution applied to the wafer 15 from the plasma light source through the VUV transmission filter 24A is corrected to be uniform, whereby it is possible to uniformly process the wafer 15 with VUV light.

Sixth Embodiment

A sixth embodiment of the present invention will be described with reference to FIGS. 15A and 15B.

Figure 15A:
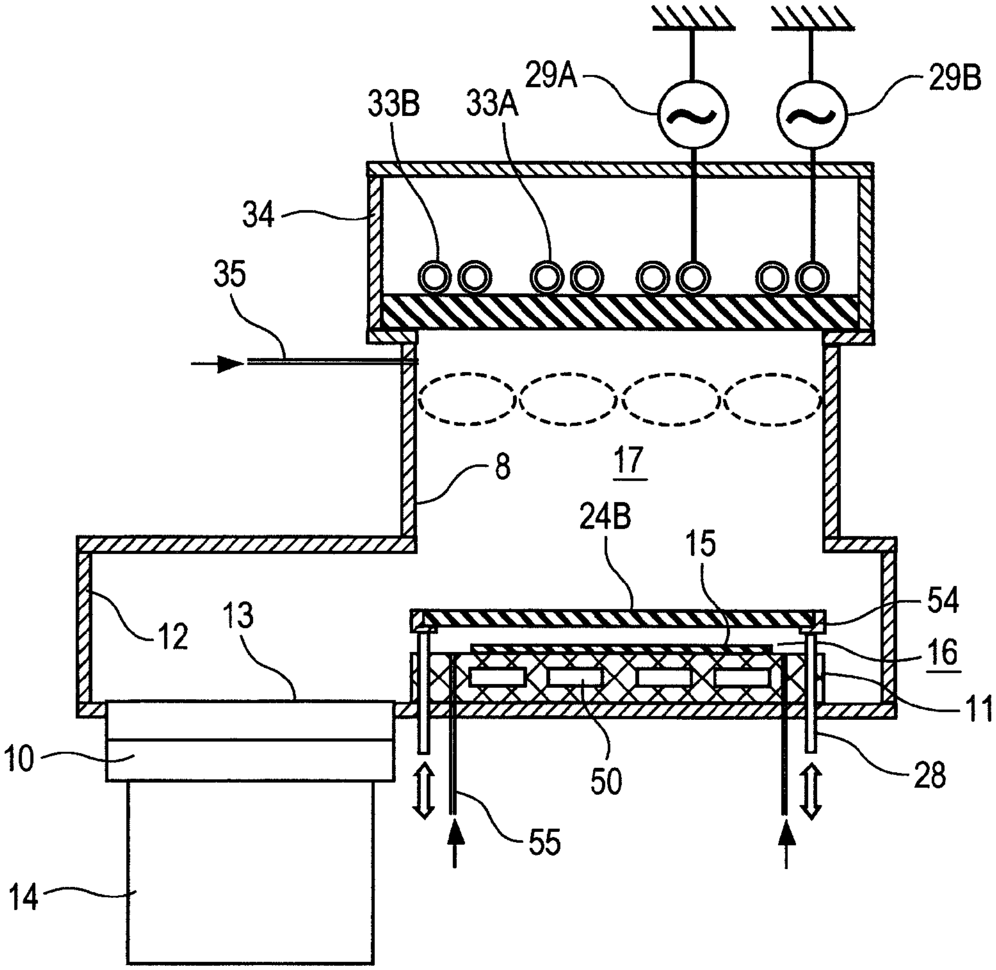
FIG. 15A is a vertical cross sectional view illustrating a VUV (Vacuum Ultraviolet light) processing apparatus using a flat inductively coupled plasma (ICP or a transformer coupled plasma TCP) light source according to a sixth embodiment of the present invention.
Figure 15B:
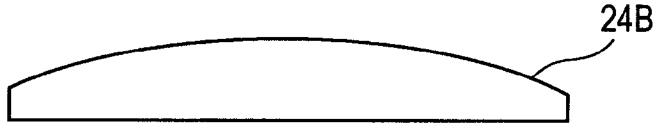
FIG. 15B is a vertical cross sectional view illustrating a VUV transmission filter including a VUV light intensity distribution correcting function according to the sixth embodiment of the present invention.

This embodiment uses a flat inductively coupled plasma (ICP or TCP) source as illustrated in FIG. 15A, instead of using the effective magnetic field microwave plasma source for the plasma light source in the embodiment illustrated in FIG. 11.

In FIG. 15A, 29A denotes a first high frequency power supply that supplies electric power to a coil 33A on the inner side, 29B denotes a second high frequency power supply that supplies electric power to a coil 33B on the outer side, 34 denotes a shield cover, and 35 denotes a gas pipe. In the nearly cylindrical chamber 8 that the pressure inside the chamber can be reduced, there are the plasma generating space 17 and the VUV light processing space 16 located therebelow, and a VUV transmission filter 24B is disposed between the two spaces. The configuration of the VUV light processing space 16 is the same as in the third embodiment.

Also in this embodiment, there are the similar effect and operation as in the third embodiment.

Moreover, in this embodiment, electric power supplied from the first high frequency power supply 30 and the second high frequency power supply 30 causes the VUV light intensity distribution of the plasma light source to be convex, flat, or concave. It is sufficient that the plate thickness of the VUV transmission filter 24B is changed according to the VUV light intensity distribution of the plasma light source.

Generally, VUV light absorption is more increased as the plate thickness of the VUV transmission filter 24B is thicker, and VUV light is attenuated (in detail, it is necessary to consider multiple reflection or the like on both front and back surfaces). Therefore, in the case where the VUV light intensity distribution of the plasma light source is convex, the cross section of the VUV transmission filter 24B is made convex as illustrated in FIG. 15B, whereby it is possible to correct the VUV light intensity distribution to be uniform, which is applied to the wafer 15. In the case where the VUV light intensity distribution is concave, it is sufficient that the VUV transmission filter 24A as illustrated in FIG. 14B is adopted to correct the VUV light intensity distribution to be uniform. As described above, it is possible to uniformly process the wafer 15 with VUV light.

Seventh Embodiment

A seventh embodiment of the present invention will be described with reference to FIG. 16.

Figure 16:
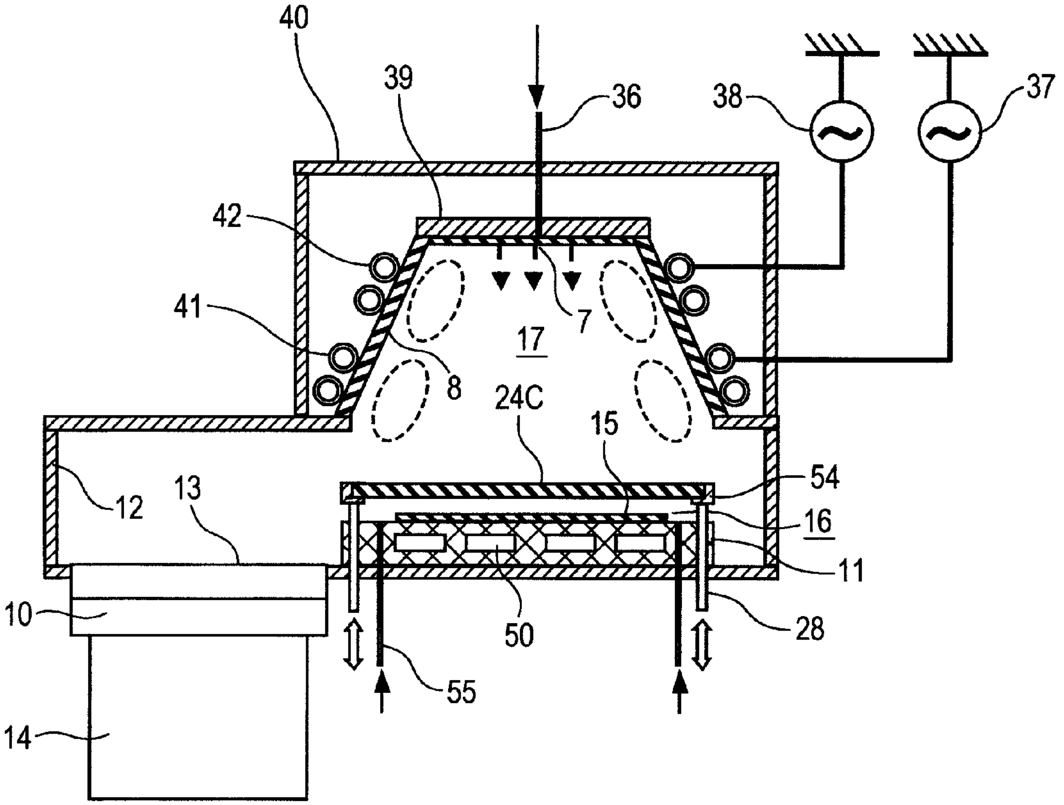
FIG. 16 is a vertical cross sectional view illustrating a VUV (Vacuum Ultraviolet light) processing apparatus using a trapezoid inductively coupled plasma (ICP) light source according to a seventh embodiment of the present invention.

This embodiment uses a trapezoid inductively coupled (ICP) plasma source as illustrated in FIG. 16, instead of using the effective magnetic field microwave plasma source for the plasma light source in the embodiment illustrated in FIG. 11.

In FIG. 16, 36 denotes a gas pipe, 37 denotes a first high frequency power supply that supplies electric power to a coil 41 on the lower side, 38 denotes a second high frequency power supply that supplies electric power to a coil 42 on the upper side, and 39 and 40 denote a shield cover. In the chamber 8 of nearly truncated cone shaped, wherein the pressure inside the chamber can be reduced, there are the plasma generating space 17 and the VUV light processing space 16 located therebelow, and a VUV transmission filter 24C is disposed between the two spaces. The configuration of the VUV light processing space 16 is the same as in the third embodiment. It is sufficient that the shape of the VUV transmission filter 24C is appropriately selected according to the VUV light intensity distribution of the plasma light source.

Also in this embodiment, there are the similar effect and operation as in the third embodiment.

In addition to this, the similar effect and operation can be exerted also using a surface wave plasma source, a parallel plate plasma source, a magnetron discharge plasma source, a dielectric barrier discharge plasma source, or the like.

In the plasma sources described above, plasma uniformity is varied depending on the conditions such as gas species, pressure, a flow rate, a magnetic field, and microwave (high frequency) electric power. Accordingly, the uniformity of VUV light (vacuum ultraviolet light) is varied, which is emitted from the plasma light source, transmitted through the VUV transmission filter 24, and applied to the wafer 15, so that the plasma conditions described above are optimized. In the case of the effective magnetic field microwave plasma source in FIGS. 1 to 12, the conditions of a magnetic field and microwave output are often changed. In the case of inductively coupled plasma (ICP) discharge using two power supplies in FIGS. 15A and 16, the input electric power of the two power supplies and the ratio between the power supplies are often changed.

Eighth Embodiment

An eighth embodiment of the present invention will be described with reference to FIGS. 17A and 17B.

Figure 17A:
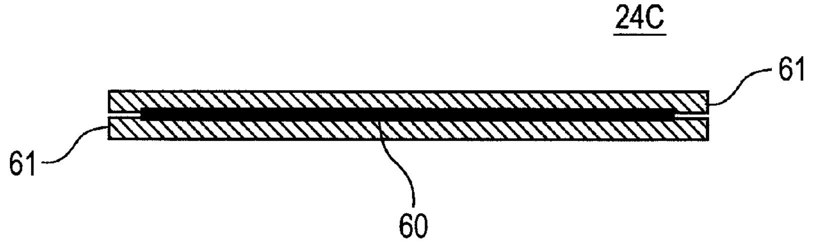
FIG. 17A is a vertical cross sectional view illustrating a VUV transmission filter including a VUV light intensity distribution correcting function according to an eighth embodiment of the present invention.
Figure 17B:
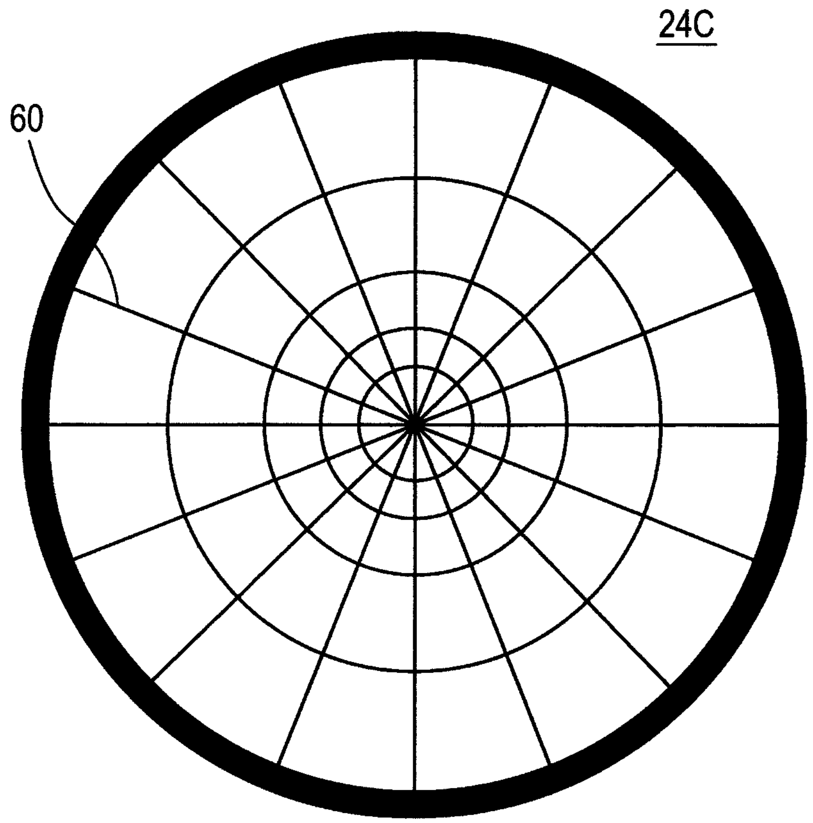
FIG. 17B is an exemplary penetration pattern of light intensity correction penetration of the VUV transmission filter in FIG. 17A.

In this embodiment, alight intensity correction through plate 60 that an aperture ratio is changed in the plane as illustrated in FIG. 17B and a cover 61 that covers two surfaces of the plate 60 with a VUV transmission material as illustrated in FIG. 17A are provided, instead of changing the plate thickness of the VUV transmission filter 24C according to the VUV light intensity distribution of the plasma light source in the seventh embodiment, for example. The light intensity correction through plate 60 is made of a material that does not transmit VUV light such as a metal plate, a ceramics plate, a glass plate, and a Si plate. In this embodiment, a thin stainless steel plate was used. Moreover, the in-plane distribution (the aperture ratio) of the through part is changed so as to provide a desired in-plane light intensity distribution using a plurality of openings, that is, a through mesh structure or a structure with a large number of through holes, thereby correcting the in-plane light intensity distribution of VUV light.

In this embodiment, the pattern is a radial pattern as illustrated in FIG. 17B. The pattern may be any given patterns according to the light intensity distribution of the plasma light source such as a mesh pattern and a dot pattern with holes, for example. The cover 61 made of a VUV transmission material has the effect that suppresses contamination or the like due to sputtering, reactions, or the like caused by plasma or the like. This embodiment has the effect and operation similar to the seventh embodiment.

Moreover, such a configuration may be possible in which the VUV light intensity distribution correcting unit in the fifth to seventh embodiments of the present invention can be exchanged using a wafer transfer robot (omitted in the drawing) or the like as similar to the VUV transmission filter 24 (24A to 24C) described above. Thus, there is the effect that it is possible to perform VUV light processing with a desired VUV light intensity distribution according to the wafer 15, which is a sample to be processed.

Furthermore, for the application of the embodiment described above, this embodiment is applicable to removing organic contamination on a wafer or a photomask, low-k film curing, a reduction in LWR of a resist pattern, suppressing CD fluctuations in a resist pattern caused by electrons or the like, resist trimming (CD control), and so on. In addition to this, the present invention is applicable to any applications in which VUV light (vacuum ultraviolet light) is applied to a sample to be processed such as a wafer and the sample is processed, exerting the similar effect and operation.

Ninth Embodiment

Next, the application of the VUV light (vacuum ultraviolet light) processing apparatus will be described. As described above, when the plasma etching apparatus is used to etch laminated under thin films with the photoresist circuit pattern formed with the roughness as a mask, roughness similar to the roughness on the surface or the side surface of the photoresist is also formed on the side surface of the etched under thin films.

Moreover, the roughness on the surface or the side surface of this photoresist sometimes grows due to etching the resist or the deposition of reaction products in the process of etching.

For example, in processing a gate electrode of a MOS transistor, roughness on the photoresist surface is transferred to the side surface of a polysilicon layer, and gate electrode with a roughness of a few nanometers is formed. Since the gate length is reduced to a few tens nanometers with the downscaling of LSI (Large Scale Integration), the roughness of the order of a few nanometers greatly affects the characteristics of the MOS transistor. For the influence on the actual device characteristics, the roughness of a few nanometers on the side surface of the polysilicon layer causes a short channel effect, leading to an increase in a leakage current or a reduction in threshold voltage. Moreover, the roughness of a few nanometers on the side surface of a positive silicon layer causes variations in the gate length each of transistors, leading to a reduction in yields on the performance of transistors.

A problem of roughness (LER and LWR) as described above arises not only in etching the polysilicon electrode but also in a high-k/metal gate structure, or three-dimensional structure MOSFET (for example, a fin type FET), which is named as the structures of next generation MOS transistors.

A method for improving the etch resistance of a resist, such a process is studied in which an electron beam is applied to cure a photoresist, or vacuum ultraviolet light at a wavelength of 200 nm or less is applied to a resist pattern obtained by development for curing. However, in these methods, the electron beam or VUV light is applied after forming the resist pattern, and it is difficult to bring curing effect into the inside of the resist pattern or an anti-reflective film. Thus, in the process of etching layers below the anti-reflective film, such a tendency is observed that roughness on the surface and the side surface is grown to degrade LER and LWR.

According to the application of a representative processing apparatus of the present invention, the processing apparatus includes: an ultraviolet light applying unit including a plasma generating unit that supplies high frequency energy into a vacuum chamber to generate plasma; an etching unit that etches a sample brought in the processing space; a vacuum side transport chamber including a transfer unit that is connected to the etching unit and brings the sample in and out of the etching unit in a vacuum atmosphere; and an atmospheric transport chamber including a transfer unit that brings the sample in the atmosphere to the vacuum side transport chamber side through a lock chamber and brings the processed sample out of the vacuum side transport chamber side through the lock chamber for returning the processed sample to the atmosphere. In an etching apparatus that etches a sample having a substrate formed with an anti-reflective film and a resist thereon, the vacuum side transport chamber applies vacuum ultraviolet light to the sample for curing the resist and the anti-reflective film.

According to the application of the present invention, it is possible to provide a plasma processing technique that can suppress roughness which occurs on the surface or the side surface of a photoresist film formed on a semiconductor substrate in forming interconnection patterns and can implement highly accurate etching.

Figure 18:
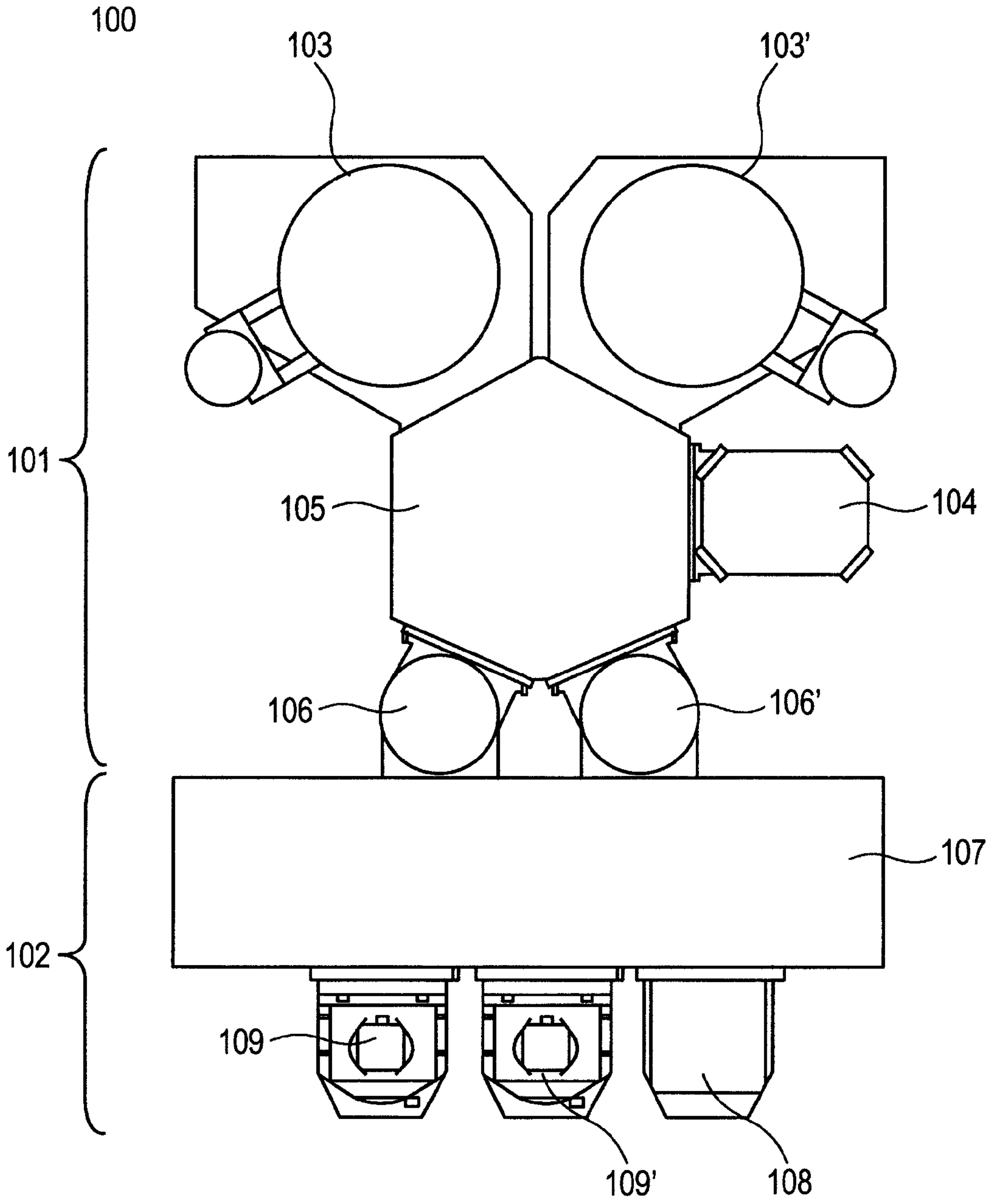
FIG. 18 is a diagram illustrating the schematic configuration of a plasma etching apparatus according to a ninth embodiment of the present invention.

In the following, a ninth embodiment of the present invention will be described with reference to the drawings. FIG. 18 is a diagram illustrating the schematic configuration of a plasma etching apparatus according to this embodiment. In FIG. 18, a plasma processing apparatus 100 is roughly separated into a vacuum side block 101 on the upper side in FIG. 18 and an atmosphere side block 102 on the lower side in FIG. 18.

The atmosphere side block 102 includes a mounting stage 108 on which cassettes 109 and 109' are placed. The cassettes 109 and 109' can accommodate a plurality of samples to be processed by the vacuum processing apparatus 100. In an atmosphere side transport chamber 107, a transport chamber is disposed, which is a space into which samples to be processed in the cassette 109 are brought.

The vacuum side block 101 includes a vacuum side transport chamber 105 disposed at the center part, and a plurality of vacuum chambers mounted on the side walls corresponding to the sides of the polygon of the vacuum side transport chamber 105 and connected thereto. On two side walls on the upper side of the vacuum side transport chamber 105, etching units 103 and 103' are provided, each having a processing chamber to etch samples to be processed therein. Moreover, on the side wall of the vacuum side transport chamber 105 on the right side in FIG. 18, an ultraviolet light applying unit 104 is disposed to apply ultraviolet light (an ultraviolet wavelength in a range near short wavelengths of 10 to 200 nm in ultraviolet light) to samples to be processed therein. It is noted that the samples to be processed are vacuum-transported between the etching unit 103 and the ultraviolet light applying unit 104.

Between the atmosphere side transport chamber 107 and the vacuum side transport chamber 105, load lock chambers or unload lock chambers 106 and 106' are disposed, which are vacuum chambers to deliver samples to be processed between atmosphere and vacuum.

It is noted that in the case of providing a unit to generate vacuum ultraviolet light in the etching units 103 and 103', it is unnecessary to provide the vacuum ultraviolet light applying unit 104. In this embodiment, an example that the vacuum ultraviolet light applying unit is disposed near the etching apparatus will be described.

Figure 19:
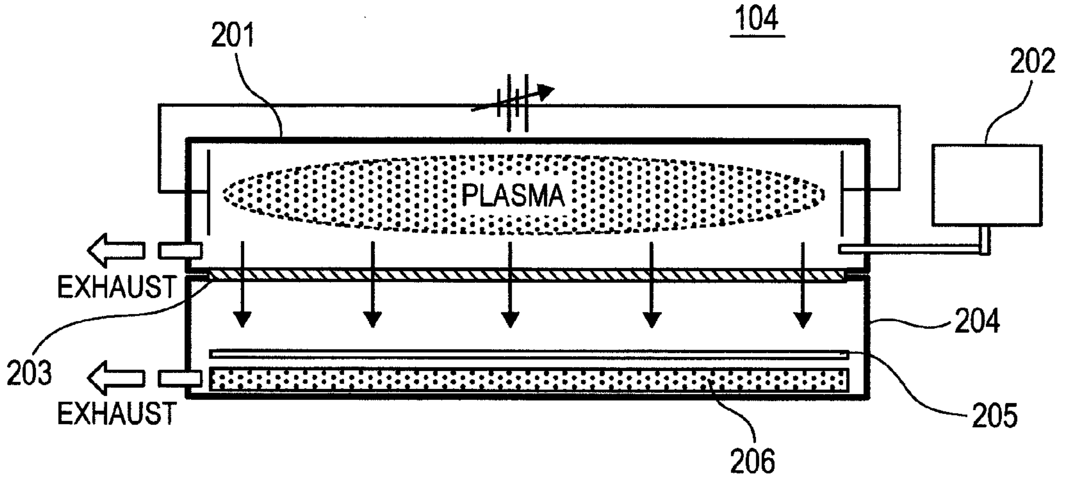
FIG. 19 is a diagram illustrating an exemplary vacuum ultraviolet light applying unit according to the ninth embodiment.

FIG. 19 is a diagram illustrating an exemplary vacuum ultraviolet light applying unit. FIG. 19 is a cross sectional view illustrating an apparatus to apply vacuum ultraviolet light from plasma. In FIG. 19, the vacuum ultraviolet light applying unit is roughly separated into a plasma generating vacuum chamber 201 on the upper side and a sample processing chamber 204 on the lower side. A vacuum ultraviolet light transmission window 203 partitions the plasma generating vacuum chamber 201 and the sample processing chamber 204.

The material of the vacuum ultraviolet light transmission window 203 is made of a material that transmits an emission wavelength shorter than an exposure wavelength, such as synthetic silica, magnesium fluoride ($MgF_2$), calcium fluoride ($CaF_2$), or lithium fluoride (LiF), for example. The plasma generating vacuum chamber 201 includes a gas supply apparatus 202 that supplies a gas to be turned into plasma. Gas species to be turned into plasma may be any gas species having an emission wavelength shorter than an exposure wavelength. For example, a mono gas such as hydrogen gas, helium gas, argon gas, hydrogen bromide gas, and nitrogen gas, and a mixed gas containing these gases are used. For a plasma generating method in the plasma generating vacuum chamber 201, it is sufficient that uniform plasma can be generated. For example, an ICP (Inductively Coupled Plasma) etching apparatus, a parallel plate plasma etching apparatus, an ECR (Electron Cyclotron Resonance) etching apparatus, or the like is used.

The plasma generating vacuum chamber 201 is connected with an evacuation apparatus (omitted in the drawing) through an air outlet port. Moreover, in the processing chamber 204 into which a sample to be processed is brought, a sample fixing electrode 206 (omitted in the drawing) is provided, including a vacuum chuck function and a heating and cooling function.

Furthermore, the processing chamber 204 is connected with an evacuation apparatus (omitted in the drawing) through an air outlet port as similar to the plasma generating vacuum chamber 201. Thus, in the case where nitrogen gas is introduced into the processing chamber 204 and vacuum ultraviolet light is applied in an atmosphere, it is possible to prevent the development of the deterioration or ashing of a resist caused by ozone to be generated.

It is necessary that a sample to be processed is applied with vacuum ultraviolet light in a vacuum preferable for resist processing, or under a preferable gas pressure. Thus, the gas supply apparatus and a pressure control apparatus are disposed in the processing chamber 204 as necessary.

In applying vacuum ultraviolet light, a sample 205 to be processed is transported to the processing chamber 204, and chucked on and fixed to the sample fixing electrode 206, and the temperature of the sample fixing electrode is controlled to adjust the temperature of the sample to be processed.

Subsequently, a gas is supplied from the gas supply apparatus 202 to the plasma generating vacuum chamber 201 for generating plasma. The vacuum ultraviolet light generated from this plasma is applied to the sample 205 to be processed through the ultraviolet light transmission window 203. Thus, it is possible to reduce roughness formed on the surface or the side surface of the photoresist.

It is noted that for another exemplary vacuum ultraviolet light applying unit, an excimer lamp to apply vacuum ultraviolet light is used for a light source instead of plasma. In this case, a discharge tube (an excimer lamp) is provided in an excimer lamp unit. For the discharge tube, a light source at a peak wavelength shorter than an exposure wavelength is used, such as a xenon light source (a peak wavelength of 172 nm), a krypton light source (a peak wavelength of 146 nm), and an argon light source (a peak wavelength of 126 nm), for example.

In applying vacuum ultraviolet light, a sample to be processed is transported to a processing chamber, and chucked on and fixed to a sample fixing electrode, and the temperature of the sample fixing electrode is controlled to adjust the temperature of the sample to be processed. The processing chamber is adjusted to a vacuum preferable for the processing of ultraviolet light application, or to a preferable gas pressure. Subsequently, vacuum ultraviolet light generated from the excimer lamp unit is applied to the sample to be processed through an ultraviolet light transmission window. Thus, it is possible to reduce roughness formed on the surface or the side surface of the photoresist.

Comparative Example

Here, a comparative example will be described.

Figure 20:
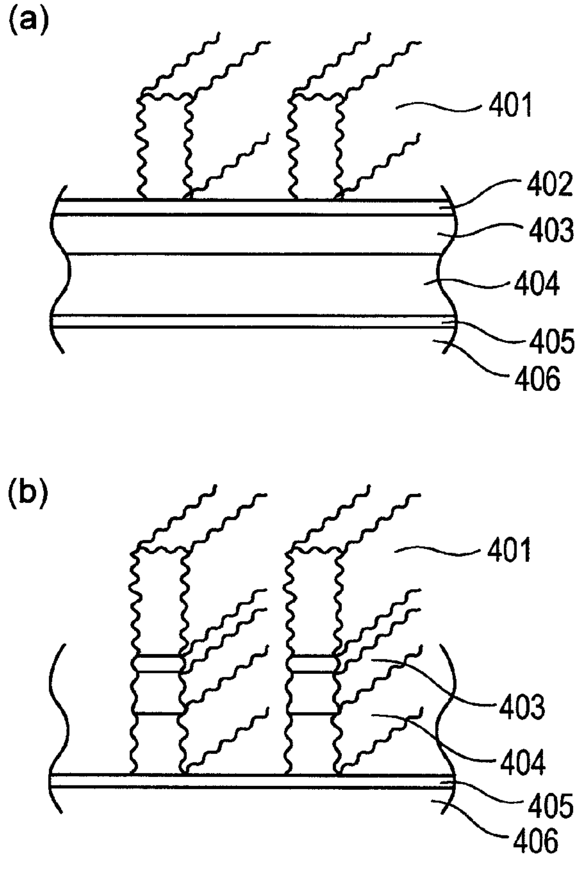
FIG. 20 is a diagram illustrative of an etching process (a comparative example).

FIG. 20 shows diagrams illustrative of an example (a comparative example) that plasma is used to etch a semiconductor substrate or the like.

FIG. 20(*a*) is a cross sectional view illustrating a typical method for forming the gate electrode of a MOS transistor. As illustrated in FIG. 20(*a*), a gate insulating film layer 405 is formed on a semiconductor substrate 406, and a gate electrode material is deposited thereon to form a conductive film layer 404. Moreover, a mask layer (a hard mask layer, for example) 403 is formed on the conductive film layer 404. Subsequently, an organic material is coated on the mask layer 403 to form an anti-reflective film (a BARC (Bottom Anti-Reflection Coating), for example) layer 402, or a BARL (Bottom Anti-Reflection Layer) is formed using an inorganic material for the anti-reflective film in exposing a photoresist. Lastly, a resist material is coated on the anti-reflective film 402 by spin coating, and a circuit pattern is exposed by projecting printing using an ArF laser or the like for development, thereby forming a photoresist mask pattern 401.

In exposure in the photolithography techniques, it is necessary to deliver an exposing light to the bottom part of a resist with sufficient intensity. However, an unnecessary portion of a photoresist material is exposed to light due to reflection at a thin film surface or irregular reflection at a step portion or the like, and ununiformity occurs in exposure. In this case, unnecessary roughness occurs on the surface or the side surface of the circuit pattern of the photoresist formed in development.

Moreover, unnecessary roughness is also formed on the surface or the side surface of the resist due to the ununiformity of resist polymer size, the aggregation of polymers, and the ununiformity of acid diffusion in chemical amplification reactions.

FIG. 20(*b*) illustrates a shape after etching. In the conventional etching method, the photoresist circuit pattern 401 formed with the roughness is used as a mask to etch under layers that is laminated thin films. Thus, roughness is also formed on the side surface of the etched under thin films as similar to the roughness formed on the surface or the side surface of the photoresist. Furthermore, this roughness tends to enlarge due to the contraction or expansion of the resist mask pattern caused by gas in the process of etching.

Tenth Embodiment

Figure 21:
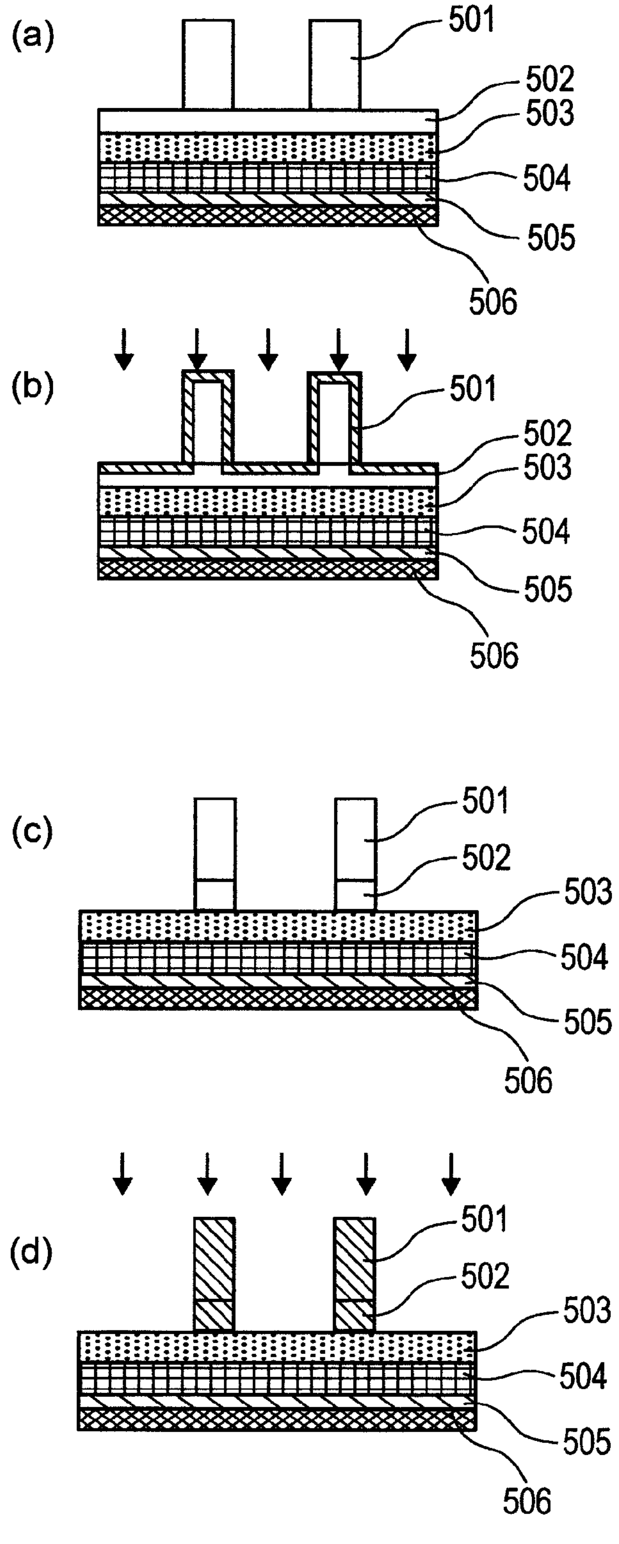
FIG. 21 is a diagram illustrative of an etching process according to a tenth embodiment of the present invention.

FIG. 21 shows diagram illustrative of an etching method according to a tenth embodiment of the present invention. An example illustrated in FIG. 21 is an example that performed a process for improving roughness on the surface or the side surface of a photoresist mask pattern 501 and a process for suppressing the growth of roughness which occurs in the process of etching. For the processes, a vacuum ultraviolet light applying apparatus disposed next to an etching apparatus is used to cure roughness with vacuum ultraviolet light in order to reduce roughness on the photoresist mask pattern 501 and roughness on an anti-reflective film 502.

FIG. 21(*a*) is a diagram illustrating the cross sectional structure of a sample to be processed (the gate electrode of a MOS transistor 503-506), which is exposed using an exposure apparatus, and then developed for forming a resist pattern.

Subsequently, in order to reduce roughness on the surface and the side surface of the photoresist mask pattern 501 prior to etching the sample to be processed, the sample to be processed is transported to the vacuum ultraviolet light applying unit 104 of the plasma processing apparatus 100, and vacuum ultraviolet light is applied to the entire surface of the resist pattern in a vacuum (FIG. 21(*b*)). With this vacuum ultraviolet light application, roughness on the surface of the photoresist mask pattern 501 (a hatched portion in FIG. 21(*b*)) and roughness on the surface of the anti-reflective film 502 (a hatched portion in FIG. 21(*b*)) are improved.

Subsequently, the sample to be processed is vacuum-transported from the vacuum ultraviolet light applying unit 104 to the etching unit 103, and the anti-reflective film 502 is etched.

It is noted that in the case of forming a desired circuit pattern by plasma etching, with the downscaling of LSI, a circuit pattern in dimensions smaller than the dimensions of a photoresist material that can be exposed has to be formed.

For a method of obtaining a circuit pattern in dimensions smaller than exposure critical dimensions using an exposure apparatus, a trimming process is used for the purpose of forming a mask pattern in mask dimensions smaller than an exposed, developed photoresist pattern in plasma etching. This trimming process is also called a slimming process or a shrinking process, and the trimming process is generally performed before etching the anti-reflective film or after etching the anti-reflective film.

FIG. 21(*c*) illustrates a cross sectional structure after etching and trimming the anti-reflective film. The surface of the photoresist mask pattern 501 and the surface of the anti-reflective film 502 cured with vacuum ultraviolet light in FIG. 21(*b*) are removed by etching and trimming the anti-reflective film. Thus, in the case where laminated films under a mask layer 503 are etched in the state in FIG. 21(*c*), there is a problem in that roughness again occurs due to the contraction or expansion of the resist mask pattern 501 or the anti-reflective film 502 caused by an etching gas.

For this problem, after etching and trimming the anti-reflective film, the sample to be processed is again transported from the etching unit 103 to the vacuum ultraviolet light applying unit 104, and vacuum ultraviolet light is applied to the entire surface of the resist pattern in a vacuum (FIG. 21(*d*)). With this vacuum ultraviolet light application, the resist mask pattern 501 and the anti-reflective film 502 are cured with vacuum ultraviolet light to the inside thereof. After applying vacuum ultraviolet light, the sample to be processed is again vacuum-transported from the vacuum ultraviolet light applying unit 104 to the etching unit 103 for etching laminated films under the mask layer 503.

Thus, the transfer of roughness formed on the surface or the side surface of the resist mask pattern 501 and the growth of roughness in the etching process are suppressed, and roughness (LER) on the line side surface or the roughness of line width (LWR) is reduced.

It is noted that the etching unit 103 and the vacuum ultraviolet light applying unit 104 are connected to each other in vacuum transport. Thus, it is possible to suppress the deterioration of the sample surface after vacuum ultraviolet light application due to unnecessary oxidation or the like, and it is possible to expect the effect of reducing LER and LWR in etching.

Figure 22:
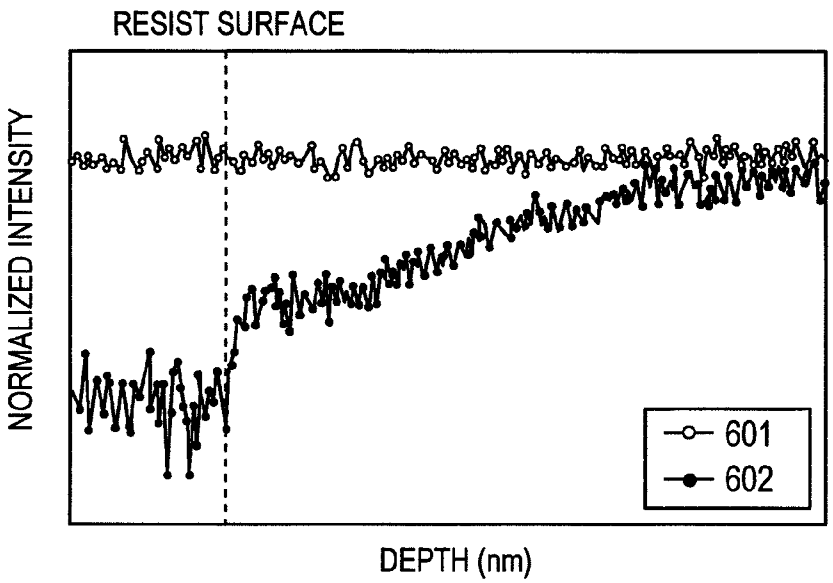
FIG. 22 is a diagram illustrating the effect of vacuum ultraviolet light application according to the tenth embodiment.

FIG. 22 is a diagram illustrating the effect of vacuum UV application according to this embodiment. FIG. 22 illustrates the depth direction profile of a main chain component of an organic polymer forming a resist material, and the profile is obtained by time-of-flight secondary ion mass spectrometry (TOF-SIMS). The left side of a dotted line in FIG. 22 is a resist surface, and the right side in FIG. 22 is a resist deep portion. In FIG. 22, 601 expresses a sample applied with no vacuum ultraviolet light, and 602 expresses a sample applied with vacuum ultraviolet light at an accumulated illuminance of 2.0 $mJ/cm^2$.

As apparent from FIG. 22, in the case of applying no vacuum ultraviolet light, the structure of the main chain component of the organic polymer is not changed in the resist depth direction. In contrast to this, it was confirmed that in the sample applied with vacuum ultraviolet light at an accumulated illuminance of 2.0 $mJ/cm^2$, the main chain component of the organic polymer forming the resist material is gradually reduced from a deep portion to the surface (the main chain structure is decomposed to the deep portion). It is noted that the similar result was confirmed also on the anti-reflective film.

From this result, a cause can be considered that applying vacuum ultraviolet light to the resist mask pattern and the anti-reflective film, that is, applying wavelength light with photon energy higher than the binding energy of various molecules contained in the organic polymer forming the resist and the anti-reflective film (C—C bond, C═C bond, C—O bond, C═O bond, and C—H bond, for example) promotes the decomposition of the main chain component, and relaxes the contraction or expansion of the organic polymer forming the resist and the anti-reflective film due to an etching gas (the organic polymer film is improved and reinforced).

Figure 23:
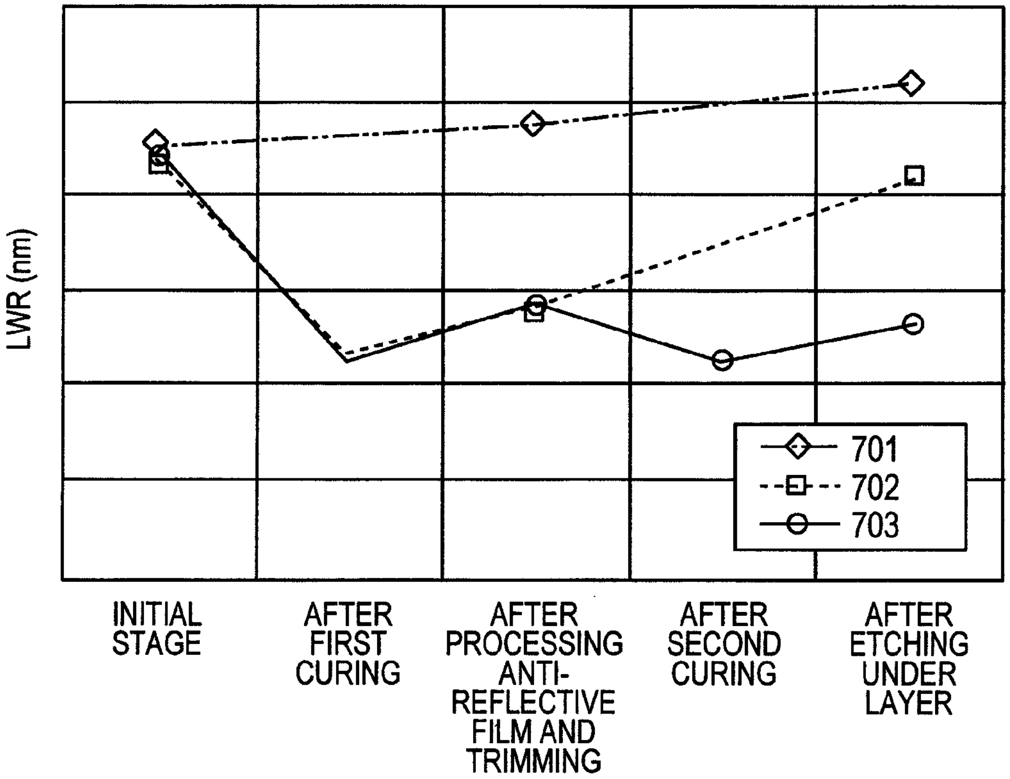
FIG. 23 is a diagram illustrative of the effect exerted on the roughness of line width (LWR) according to the tenth embodiment.

FIG. 23 is a diagram illustrative of the effect given to line width roughness (LWR). In FIG. 23, the horizontal axis expresses process steps, and the vertical axis expresses a LWR value.

First, (1) in the case where first and second vacuum ultraviolet curing processes are not performed on the resist mask pattern and the anti-reflective film (701), roughness formed on the surface and the side surface of the resist mask pattern is transferred to the anti-reflective film. Moreover, this roughness causes the contraction or expansion of the organic polymer forming the resist and the anti-reflective film in etching and trimming the anti-reflective film and in etching under layers, and is transferred to the side surface of the gate electrode in an enlarged form.

(2) In the case where only the first vacuum ultraviolet curing process is performed on roughness formed on the surface and the side surface of the resist mask pattern (702), although LWR is reduced after the first vacuum ultraviolet curing process, the contraction or expansion of the organic polymer forming the resist and the anti-reflective film occurs in later etching and trimming the anti-reflective film and etching under layers, and roughness is enlarged and transferred to the side surface of the gate electrode.

(3) In the case where the first vacuum ultraviolet curing process is performed on the surface and the side surface of the resist mask pattern and the second vacuum ultraviolet curing process is performed after etching and trimming the anti-reflective film (703), in this case, the contraction or expansion of the organic polymer forming the resist and the anti-reflective film is suppressed also in etching under layers in addition to in etching and trimming the anti-reflective film. Thus, roughness formed on the surface and the side surface of the resist mask pattern is not transferred, and roughness is not grown in the process of etching, thereby greatly reducing LER and LWR that occur on the side surface of the gate electrode.

As described above, according to this embodiment, in etching a sample to be processed with thin films (a gate insulating film, a conductive film, and a mask layer) laminated on a semiconductor substrate, an anti-reflective film formed on the thin films, and a photoresist mask pattern formed on the anti-reflective film for forming a gate electrode, for example, vacuum ultraviolet light generated from plasma or an excimer lamp is applied before etching the mask pattern and after etching the anti-reflective film to cure the mask pattern and the anti-reflective film for reducing roughness (LER and LWR) on the surface or the side surface of the mask pattern and the anti-reflective film, and then the mask pattern is used to plasma-etch the laminated thin films below the mask pattern. Thus, it is possible to perform highly accurate etching, and it is possible to manufacture highly accurate semiconductor devices.

It is noted that in the examples above, the case is described where the vacuum ultraviolet light applying apparatus provided with the plasma generating mechanism or the excimer lamp is disposed near the etching apparatus that can vacuum-transport samples. However, the similar effect can also be obtained in the case where a similar ultraviolet light applying apparatus is provided in the etching apparatus.

Moreover, an example is taken and described in which the gate electrode of the MOS transistor is etched. However, the similar effect can be obtained also in the manufacturing processes for thin film materials and semiconductors showing similar characteristics. Furthermore, in this embodiment described above, the effect is described on the etching process in the front-end process of semiconductor devices. However, the similar effect can also be obtained by applying this embodiment to etching techniques in the back end process of semiconductor devices (wiring connection and super connect), micro machines, and the fields of MEMS (the fields of displays, optical switches, communications, storages, sensors, imagers, small-sized generators, small-sized fuel batteries, micro probers, and processing gas control systems, including the field related to the field of medical and biotechnology), and so on.

Eleventh Embodiment

Figure 24A:
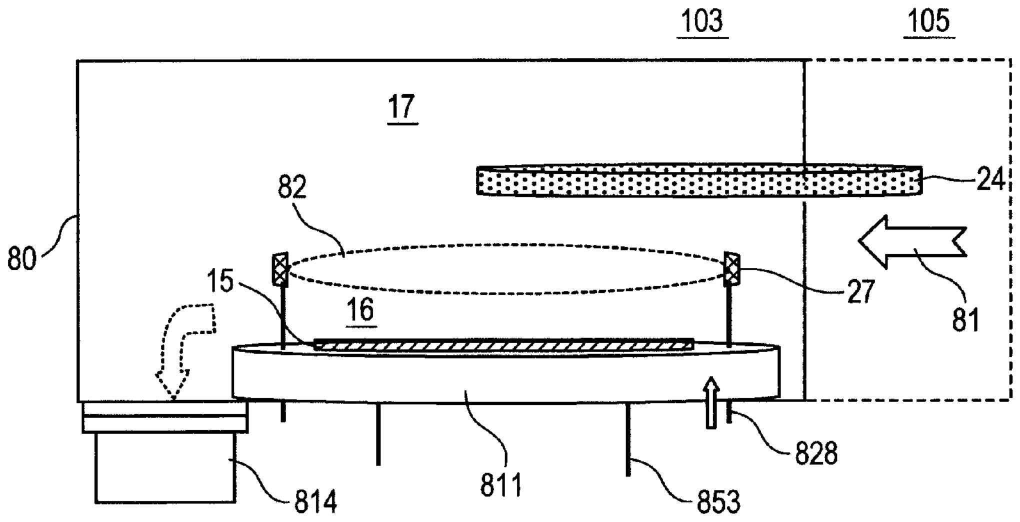
FIG. 24A is a vertical cross sectional view illustrating the essential part of a sample processing apparatus with VUV light (vacuum ultraviolet light) using a plasma light source according to an eleventh embodiment of the present invention.
Figure 24B:
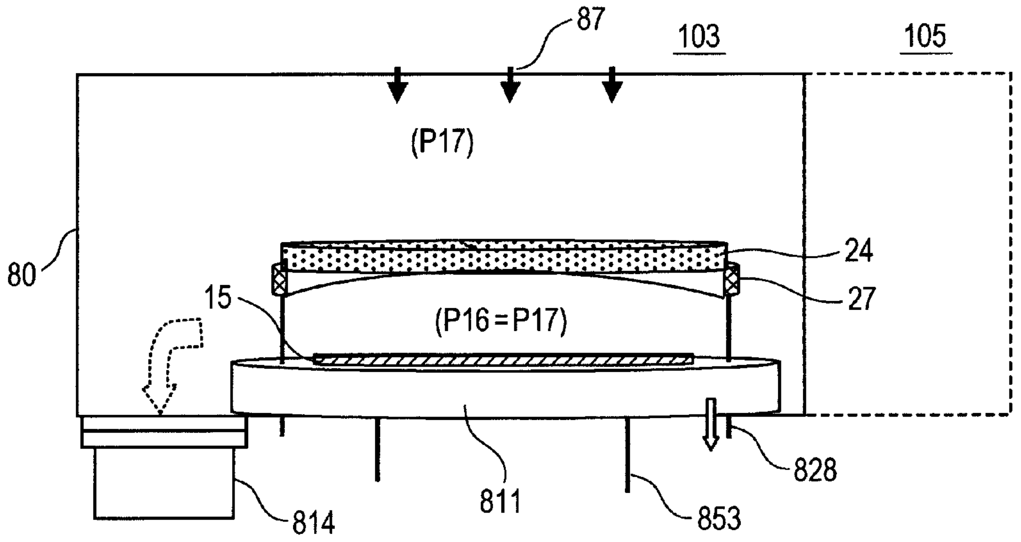
FIG. 24B is a diagram illustrative of the operation of the sample processing apparatus according to the eleventh embodiment.

FIG. 24A is a vertical cross sectional view illustrating the essential part of a sample processing apparatus with VUV light (vacuum ultraviolet light) using a plasma light source according to an eleventh embodiment of the present invention. FIG. 24B is a diagram illustrative of the operation of the sample processing apparatus according to the eleventh embodiment.

A VUV transmission filter 24 is made in which the VUV transmission filter 24 can be transported between a holding surface 82 of a filter holder 27 in a vacuum ultraviolet light applying unit 104 and a vacuum side transport chamber 105 using a wafer transfer robot (omitted in the drawing) or the like for exchanging the VUV transmission filter 24. In FIGS. 24A and 24B, numeral 80 is a chamber, 81 is filter transfer direction, 87 is a silica shower plate, 811 is a wafer mounting electrode, 814 is an evacuation apparatus, 828 is a vertical motion mechanism, and 853 is a push-up pin.

Alternatively, such a configuration may be possible in which a holder (omitted in the drawing) that can hold a plurality of the VUV transmission filters 24 is provided to exchange the VUV transmission filter 24. These methods allow the VUV transmission filter 24 to be exchangeable, whereby the VUV transmission filter 24 can be exchanged. without exposing the VUV transmission filter 24 to air even in the case where the VUV light transmission characteristics are degraded due to the contamination or the like of the VUV transmission. filter 24. Thus, there is the effect that it is possible to improve throughput and to process a wafer 15 with VUV light in excellent reproducibility.

REFERENCE SIGNS LIST

1 Magnetron
2 Rectangular waveguide
3 Matching unit
4 Circular waveguide
5 Cavity resonator
6 Silica plate
7 Silica shower plate
8 Chamber
9 Gas pipe
10 Exhaust velocity variable valve
11 Wafer mounting electrode
12 Exhaust duct
13 Open and close valve
14 Evacuation apparatus
15 Wafer
16 VUV light the processing space
17 Plasma generating space
18 Coil
19 Coil
20 Yoke
21 Rectangular-to-circular converter
23 High frequency power supply
24 VUV transmission filter
25 Gas outlet port
26 Gas inlet port
27 Movable side wall
28 Vertical motion mechanism
29 A high frequency power supply
30 A high frequency coil
31 Cover
50 Heating and cooling mechanism
53 Push-up pin
54 Filter holder
101 A vacuum side block
102 An atmosphere side block
103 Etching units
104 An ultraviolet light applying unit
105 Wafer
106 Wafer stage

300 Control unit
301 Chamber internal pressure adjusting unit
302 Power supply control unit
303 Gas supply control unit
304 VUV transmission filter position control unit
305 Transfer unit
310 Controller.

The invention claimed is:

1. A sample processing apparatus comprising:
a chamber;
a plasma generating space disposed inside the chamber, the plasma generating space being configured for plasma to be generated in the chamber;
a processing space disposed inside the chamber to be at least partially surrounded by the plasma generating space,
wherein the processing space is configured for a sample to be processed in the processing space using the plasma for a light source;
a VUV transmission filter disposed between the plasma generating space and a stage which includes a sample mounting surface on which the sample to be processed is placed;
a holding device configured to hold the VUV transmission filter and to move the VUV transmission filter vertically above the stage, and such that the holding device with the VUV transmission filter can be supported on the stage; and
an evacuation unit configured to evacuate the plasma generating space and the processing space to reduce pressure inside thereof after the VUV transmission filter has been lifted to a predetermined position by the holding device,
wherein:
the processing space is enclosed by the stage, the holding device and the VUV transmission filter,
the VUV transmission filter faces the plasma generating space and is disposed above the stage so as to cover the sample mounting surface, and is configured to enable a fluid communication between the processing space and the plasma generating space in the chamber after the VUV transmission filter has been lifted to a predetermined position by the holding device; and
the VUV transmission filter is configured to transmit VUV light including a wavelength of 200 nm or less included in the plasma light source.

2. The sample processing apparatus according to claim 1, wherein the VUV transmission filter is configured to block electrons, ions, and radicals included in the plasma.

3. The sample processing apparatus according to claim 1, wherein an outer diameter of the VUV transmission filter is larger than an outer diameter of the sample, and a height of the processing space is 5% or less of the outer diameter of the VUV transmission filter.

4. The sample processing apparatus according to claim 1, wherein the VUV transmission filter is comprised of any one material
of synthetic silica, $MGF_2$, $CaF_2$, LiF, and sapphire.

5. The sample processing apparatus according to claim 1, wherein the plasma generating space is configured to receive a gas supplied to the plasma generating space, which comprises an inert gas , a nondepositional gas, or a mixed gas of the inert gas and the nondepositional gas,
wherein the inert gas comprises any one of Ar, Xe, He, Ne, and Kr, and
wherein the nondepositional gas , comprises any one of HBr, HCI, $N_2$, $O_2$, $H_2$, $SF_6$, and $NF_3$.

6. The sample processing apparatus according to claim 1, comprising:
a gas introducing unit configured to introduce gas into the processing space,
wherein the introduced gas includes $N_2$, an inert gas, $SF_6$, $Cl_2$, HBr, $O_2$, $CF_4$, or a mixed gas of these gasses.

7. The sample processing apparatus according to claim 1, comprising: a correcting unit configured to correct a light quantity in-plane distribution of VUV light from the plasma light source applied to the sample to be processed at a wavelength of 200 nm or less.

8. The sample processing apparatus according to claim 7, wherein the correcting unit is made of a VUV transmission material and configured to correct an in-plane light intensity distribution of VUV light by changing a thickness of the VUV transmission material in a plane so that the in-plane light intensity distribution becomes a desired in-plane light intensity distribution.

9. The sample processing apparatus according to claim 7, wherein the correcting unit is made of a material that does not transmit VUV light such as a metal plate, a ceramics plate, a glass plate, or a Si plate, and has a plurality of openings having a through mesh structure or a through hole structure; and
the correcting unit corrects an in-plane light intensity distribution of VUV light by changing an in-plane distribution of an aperture ratio of the openings so that the in-plane light intensity distribution becomes a desired in-plane light intensity distribution.

10. The sample processing apparatus according to claim 7, wherein the correcting unit corrects an in-plane light intensity distribution of VUV light according to a plasma generating condition and a material of the plasma light source.

11. The sample processing apparatus according to claim 1, wherein the VUV transmission filter is exchangeable using a transfer mechanism or a plurality of holder mechanisms.

12. The sample processing apparatus according to claim 1, wherein the VUV transmission filter is provided with a temperature adjusting function such as a cooling function.

13. The sample processing apparatus according to claim 1, wherein the processing space is configured to be decompressed for the VUV light processing.

14. The sample processing apparatus according to claim 1, comprising:
a gas introducing unit configured to introduce, into the processing space, an inert gas, a process gas, or a mixed gases of the inert gas and the process gas.

15. The sample processing apparatus according to claim 14, wherein the process gas includes any one of $SF_6$, $Cl_2$, HBr, $O_2$, and CF4.

16. The sample processing apparatus according to claim 1, wherein said holding device is comprised of an annular movable sidewall located between the stage and the VUV transmission filter.

* * * * *